United States Patent
Surisawa et al.

(10) Patent No.: US 6,215,521 B1
(45) Date of Patent: Apr. 10, 2001

(54) SOLID STATE IMAGE SENSOR HAVING AN UNNECESSARY ELECTRIC CHARGE EXHAUSTING SECTION FORMED ADJACENT TO A HORIZONTAL ELECTRIC CHARGE TRANSFER SECTION, AND A METHOD FOR MANUFACTURING THE SAME

(75) Inventors: Yuji Surisawa; Yasutaka Nakashiba, both of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 08/940,117

(22) Filed: Sep. 29, 1997

(30) Foreign Application Priority Data

Sep. 27, 1996 (JP) .................................. 8-256429

(51) Int. Cl.[7] .................................................. H04N 5/335
(52) U.S. Cl. ........................................ 348/314; 348/316
(58) Field of Search .................... 348/207, 294, 348/297, 296, 298, 299, 311, 314, 316; 257/230, 232, 233, 236; H04N 5/335

(56) References Cited

U.S. PATENT DOCUMENTS 5,057,926 * 10/1991 Watanabe ............................ 348/314
5,902,995 * 5/1999 Morimoto ............................ 348/314
5,990,953 * 11/1999 Nakashiba .......................... 348/314

* cited by examiner

Primary Examiner—Tuan Ho
(74) Attorney, Agent, or Firm—Hayes, Soloway, Hennessey, Grossman & Hage, P.C.

(57) ABSTRACT

A solid state image sensor having an unnecessary electric charge exhausting section formed adjacent to a horizontal electric charge transfer section, comprises an $N^{--}$ semiconductor substrate 1 having a P-well layer 2 formed on a principal surface thereof. On the P-well layer 2, there is formed a horizontal electric charge transfer section adjacent to one end of each of a number of vertical electric charge transfer sections. A transfer channel 15A of each vertical electric charge transfer section and an electric charge barrier region 5A of a transfer channel of the horizontal electric charge transfer section are formed of an N-type semiconductor region, and an electric charge storing region 6A of the transfer channel of the horizontal electric charge transfer section are formed of an $N^+$ semiconductor region. A potential barrier region 11A is formed at the side of the horizontal electric charge transfer section opposite to the vertical electric charge transfer sections. The unnecessary electric charge exhausting section is constituted of an $N^{++}$ semiconductor region formed at the side of the potential barrier region 11A opposite to the horizontal electric charge transfer section. The electric charge barrier region 5A and the potential barrier region 11A are formed simultaneously and have the same impurity concentration.

5 Claims, 15 Drawing Sheets

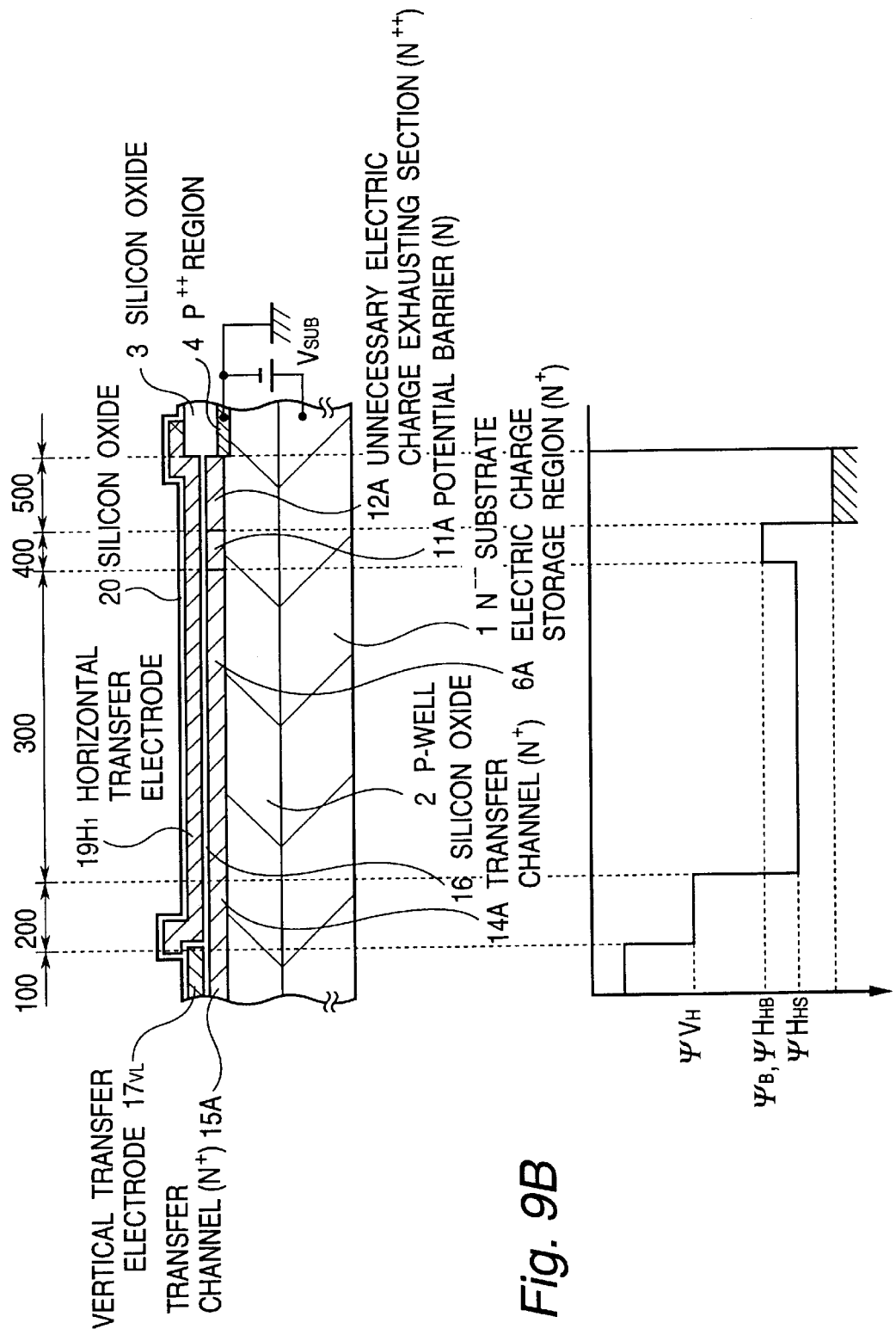

Fig. 10A
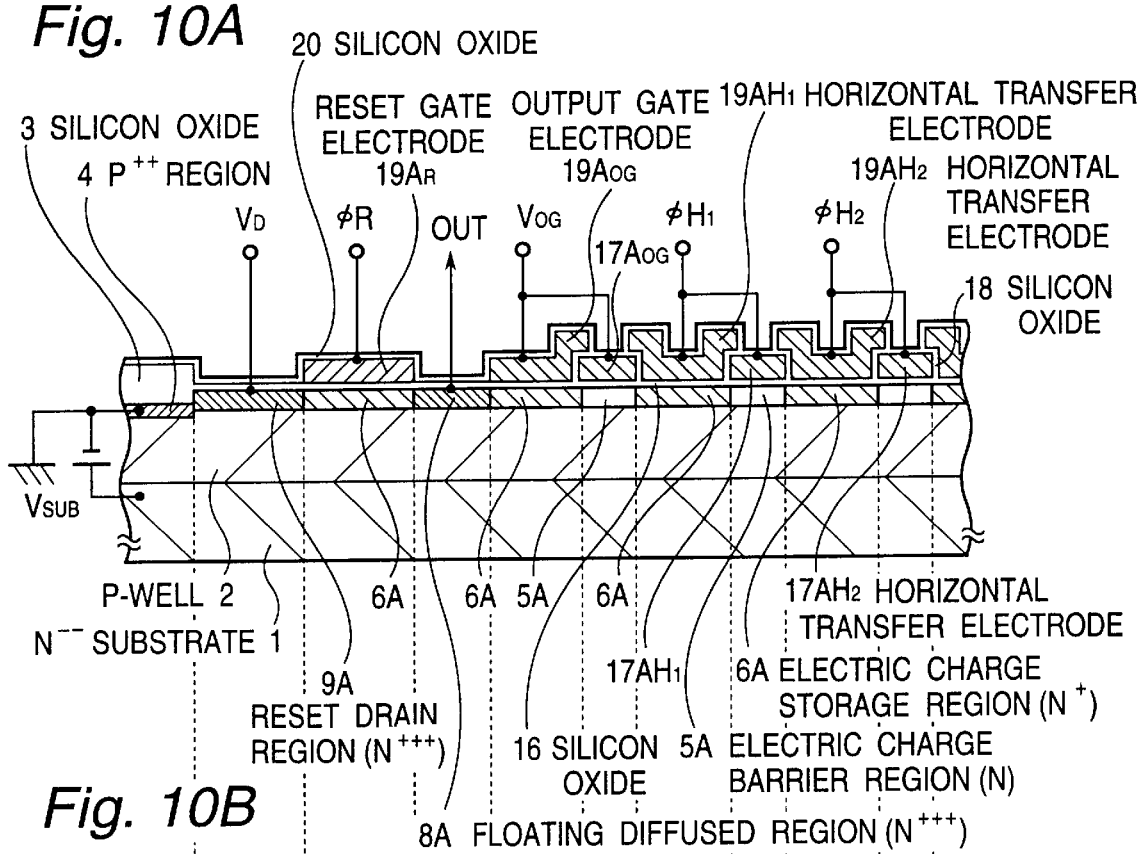
Fig. 10B
Fig. 10C
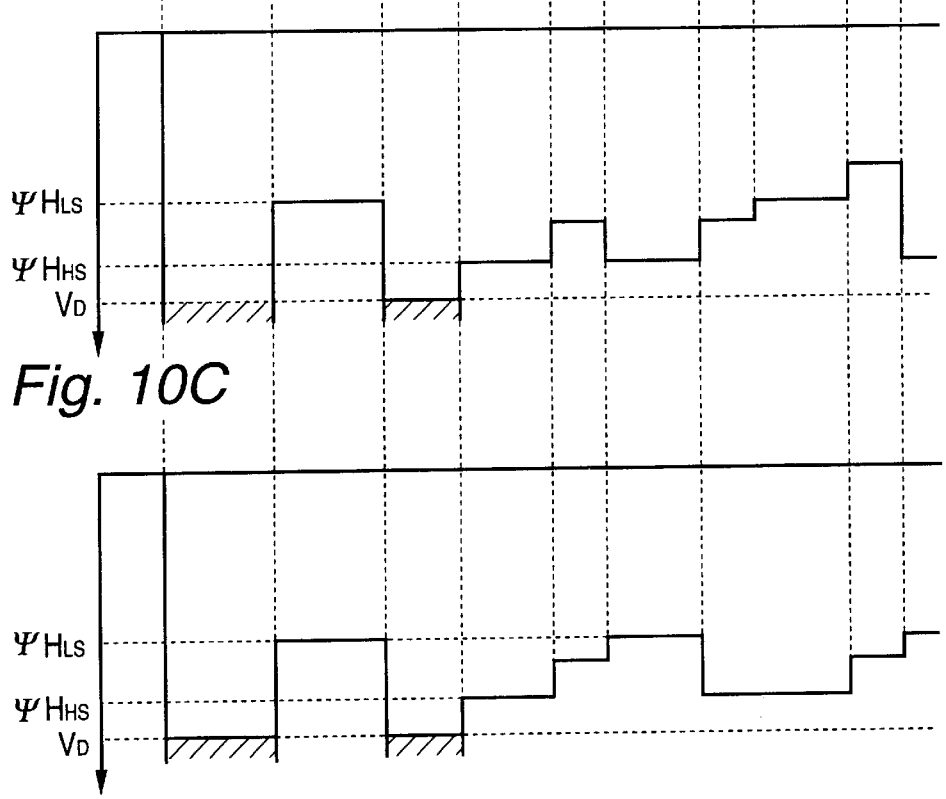

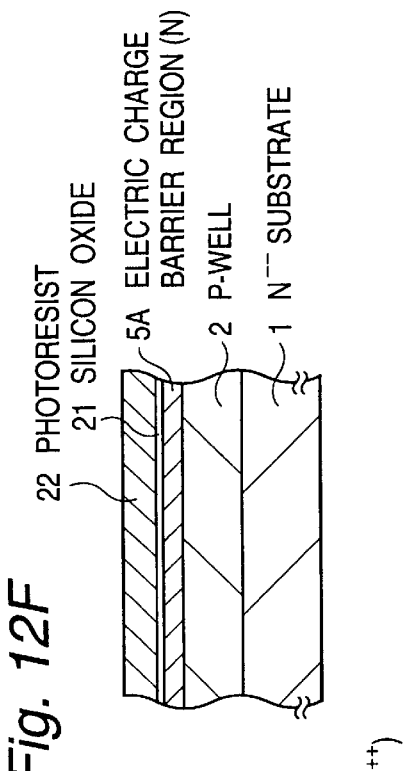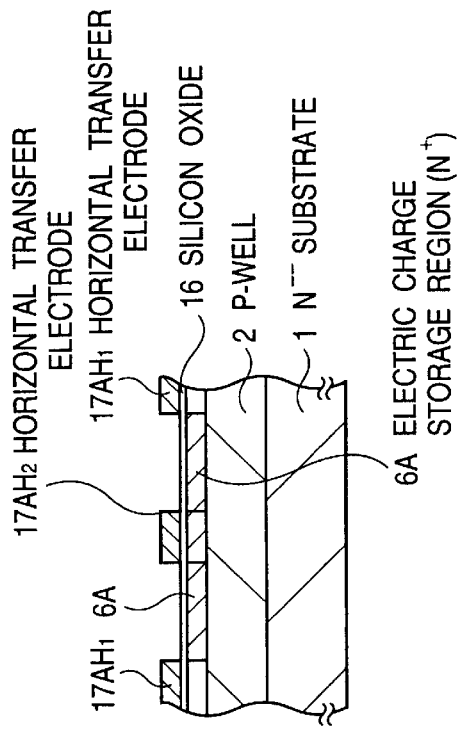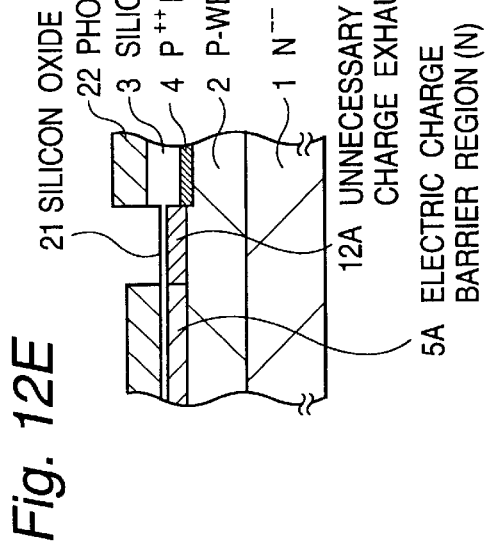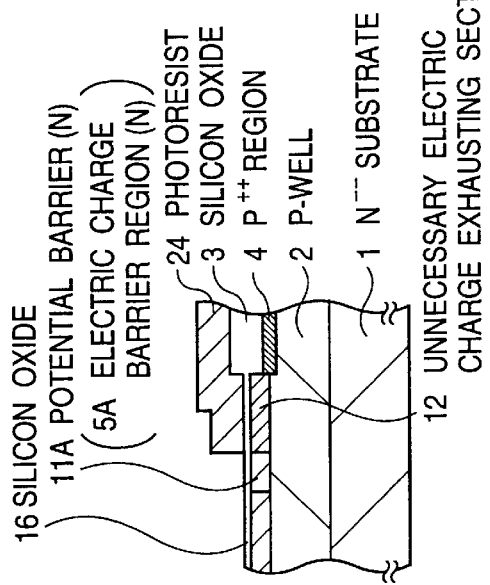

SOLID STATE IMAGE SENSOR HAVING AN UNNECESSARY ELECTRIC CHARGE EXHAUSTING SECTION FORMED ADJACENT TO A HORIZONTAL ELECTRIC CHARGE TRANSFER SECTION, AND A METHOD FOR MANUFACTURING THE SAME

BACKGROUND OF THE INVENTION

1. Field of the Invention

The present invention relates to a solid state image sensor and a method for manufacturing the same, and more specifically to a solid state image sensor having an unnecessary electric charge exhausting section formed adjacent to a horizontal electric charge transfer section, and a method for manufacturing the same.

2. Description of Related Art

A solid state image sensor, which has been conventionally widely incorporated as an image pickup means in a single-unit video camera recorder, is now increasing the number of pixels included therein, and at present, has started to be used, in place of an optical camera exposing a film, as an electronic still camera which converts optical information into an electric signal and stores the electric signal in a memory medium, to make it possible to produce a hard copy from the stored electric signal, or to reproduce the optical information on a monitor display screen.

The solid state image sensor as mentioned above, includes a photoelectric conversion section, and an electric charge transfer section for vertically and horizontally transferring a signal electric charge accumulated in the photoelectric conversion section. Actually, in addition to the signal electric charge which will become an essentially required video signal, there exists an unnecessary electric charge including an electric charge photoelectrically converted in an unnecessary period and an electric charge due to a current generated at a silicon-oxide film boundary. When the solid state image sensor is incorporated as the image pickup means in the single-unit video camera-recorder, even if the unnecessary electric charge is generated, the unnecessary electric charge will lower at an negligible level after a few frames, and therefore, the unnecessary electric charge will not become a large problem. However, when the solid state image sensor is used as the image pickup means of the electronic still camera, the unnecessary electric charge is superposed on the signal charge which should become the essentially required video signal, with the result that an image quality is deteriorated. In addition, if a substantial time is required to remove the unnecessary electric charge, there occurs a time delay from the moment a shutter button is triggered to the moment the shutter is actually opened and closed, with the result that a so-called shutter chance may be lost.

Therefore, differently from the solid state image sensor incorporated in the single-unit video camera-recorder, the solid state image sensor used as the image pickup means of the electronic still camera, is required to momentarily remove all unnecessary electric charges existing in the photoelectric conversion section and the vertical and horizontal electric charge transfer sections, at the same time as the shutter button is triggered.

As a means for removing the unnecessary electric charges, for example, Y. Ishihara et al proposes an "Interline CCD Image Sensor with Vertical Overflow Drain", in Journal of Society of Television of Japan, Vol. 37, No. 10, 1983, pages 782–787. In brief, in order to remove the unnecessary electric charges existing in the photoelectric conversion section, a $P^-$ semiconductor region having a low impurity concentration is formed directly under an N type semiconductor region constituting the photoelectric conversion section, and a reverse biasing is applied to an $N^{--}$ semiconductor substrate so that an excess electric charge is removed into the $N^{--}$ semiconductor substrate for a blooming suppression, and the N type semiconductor region itself is depleted so that all the signal electric charge is removed into the $N^{--}$ semiconductor substrate.

In addition, the unnecessary electric charge existing in the horizontal electric charge transfer section, can be removed into a reset drain provided at an end of the horizontal electric charge transfer section in a conventional operation, since the horizontal electric charge transfer section can operate at a high speed.

On the other hand, in order to remove the unnecessary electric charge existing in the vertical electric charge transfer section, it is necessary to transfer at least one to a few frames.

For example, Japanese Patent Application Pre-examination Publication No. JP-A-02-205359 (the content of which is incorporated by reference in its entirety into this application, and an English abstract of JP-A-02-205359 is available from the Japanese Patent Office, and the content of the English abstract is also incorporated by reference in its entirety into this application), proposes one method for removing the unnecessary electric charge existing in the vertical electric charge transfer. In brief, an unnecessary electric charge exhausting section is provided adjacent to the horizontal electric charge transfer section, so that the unnecessary electric charge existing in the vertical electric charge transfer section is removed by transferring the unnecessary electric charge existing in the vertical electric charge transfer section in a forward direction.

Referring to FIG. 1, there is shown a layout diagram of the solid state image sensor having the unnecessary electric charge exhausting section provided adjacent to the horizontal electric charge transfer section. The shown solid state image sensor includes an image sensor section 100, which comprises a number of photoelectric conversion cells 101 (each of which is formed of, for example, a photodiodes, and each of which will be called a "photocell" hereinafter) arranged in the form of a matrix, a plurality of vertical electric charge transfer sections 103 each of which extends along a corresponding vertical column of photocells, and a number of transfer gates 102 each provided between a corresponding photocell and a corresponding adjacent vertical electric charge transfer section 103. The vertical electric charge transfer sections 103 are driven, by four-phase drive pulses $\phi V_1$ to $\phi V_4$ to transfer signal charges through the vertical electric charge transfer section.

The shown solid state image sensor also includes a horizontal electric charge transfer section 300 formed along lower ends of the vertical electric charge transfer sections 103 and connected to the lower ends of the vertical electric charge transfer sections 103 through vertical-horizontal junction sections 200. The horizontal electric charge transfer section 300 has one end connected through an electric charge detection section 301 to an output amplification section 302.

Furthermore, the shown solid state image sensor includes an unnecessary electric charge exhausting section 500 extending along the horizontal electric charge transfer section 300, and a potential barrier section 400 formed between the horizontal electric charge transfer section 300 and the unnecessary electric charge exhausting section 500, and an N$^{+++}$ semiconductor region 501 formed at one end of the unnecessary electric charge exhausting section 500 and connected to a power supply voltage V$_D$.

Referring to FIG. 2, there is shown an enlarged layout pattern diagram, in accordance with the prior art, of a portion confined by a two-dot chain line in FIG. 1, which shows a portion of a region including the potential barrier section 400 and the unnecessary electric charge exhausting section 500 formed adjacent to the horizontal electric charge transfer section 300. The shown portion includes a transfer channel 15 of the vertical electric charge transfer sections 103, a transfer channel 14 of the vertical-horizontal junction sections 200, an electric charge barrier region 5 and an electric charge storage region 6 of a transfer channel of the horizontal electric charge transfer section 300, a potential barrier region 11 of the potential barrier section 400, an unnecessary electric charge exhausting region 12 of the unnecessary electric charge exhausting section 500.

The shown portion also includes first horizontal electric charge transfer electrodes 17H1 and 17H2 formed of a first level polysilicon film, of the horizontal electric charge transfer section 300, second horizontal electric charge transfer electrodes 19H1 and 19H2 formed of a second level polysilicon film, of the horizontal electric charge transfer section 300, and a final stage vertical electric charge transfer electrode 19VL formed of the second level polysilicon film, of the vertical electric charge transfer section 300. Each of the first horizontal electric charge transfer electrodes 17H1 and 17H2 is connected to an adjacent one, in the same direction, of the second horizontal electric charge transfer electrodes 19H1 and 19H2 to constitute a transfer electrode pair The transfer electrode pairs are alternately driven with two-phase drive pulses $\phi$H1 and $\phi$H2. Therefore, if the transfer electrode pair composed of the first and second horizontal electric charge transfer electrodes 17H1 and 19H1 is driven by $\phi$H1, the transfer electrode pair composed of the first and second horizontal electric charge transfer electrodes 17H2 and 19H2 is driven by $\phi$H2.

Referring to FIG. 3A, there is shown a diagrammatic sectional view taken along the line I—I shown in FIGS. 1 and 2. FIG. 3B is a potential profiles under the portion shown in FIG. 3A. On an N$^{--}$ semiconductor substrate 1 having the impurity concentration of for example 2.0×10$^{14}$ cm$^{-3}$, there is formed a P-type well layer 2 having the impurity concentration of for example 1.0×10$^{16}$ cm$^{-3}$. On the P-type well layer 2, there are formed an N type semiconductor region 6 having the impurity concentration of for example 1.0×10$^{17}$ cm$^{-3}$, which constitutes the transfer channel 15 of the vertical electric charge transfer section 103, the transfer channel 14 of the vertical-horizontal junction section 200, and the electric charge storage region of the transfer channel of the horizontal electric charge transfer section, a first N semiconductor region 11 having the impurity concentration of for example 6.0×10$^{16}$ cm$^{-3}$, which constitutes the potential barrier region, an N$^{++}$ semiconductor region 12 having the impurity concentration of for example 1.0×10$^{18}$ cm$^{-3}$, which constitutes the unnecessary electric charge exhausting section, and a P$^{++}$ semiconductor region 4 having the impurity concentration of for example 1.0×10$^{18}$ cm$^{-3}$, which constitutes a device isolation section.

Furthermore, these regions are covered with a silicon oxide film (3, 16), on which there are formed a first horizontal electric charge transfer electrode 17H1 formed of the first level polysilicon film, and the final stage vertical electric charge transfer electrode 19VL formed of the second level polysilicon film. The N$^{++}$ semiconductor region 12 constituting the unnecessary electric charge exhausting section, is applied with a power supply voltage V$_D$ ordinarily on the order of 15 V through an N$^{+++}$ semiconductor region (designated by Reference Numeral 13 in FIG. 5A) having the impurity concentration of for example 1.0×10$^{20}$ cm$^{-3}$ and formed at one end of the unnecessary electric charge exhausting section.

Referring to FIG. 4A, there is shown a diagrammatic sectional view taken along the line II—II shown in FIG. 1, for illustrating the prior art horizontal electric charge transfer section. FIG. 4B is a potential profiles under the portion shown in FIG. 4A when the drive clock $\phi$H1 is at a low level voltage V$_L$ and the drive clock $\phi$H2 is at a high level voltage V$_H$, and FIG. 4C is a potential profiles under the portion shown in FIG. 4A when $\phi$H1 is V$_H$ and $\phi$H2 is V$_L$. The P-type well layer 2 is formed on the N$^{--}$ semiconductor substrate 1. On the P-type well layer 2, there are formed N type semiconductor regions 6 each constituting the electric charge storage region of the transfer channel of the horizontal electric charge transfer section, N$^-$ semiconductor regions 5 having the impurity concentration of for example 7.0×10$^{16}$ cm$^{-3}$, each constituting the electric charge barrier region of the transfer channel of the horizontal electric charge transfer section, N$^{+++}$ semiconductor regions 8 and 9 constituting a floating diffused region and a reset drain region, respectively, and the P$^{++}$ semiconductor region 4 constituting the device isolation section.

These regions are covered with a silicon oxide film (3, 16), on which there are formed the first horizontal electric charge transfer electrodes 17H1 and 17H2 formed of the first level polysilicon film, an output gate electrode 17OG formed of the first level polysilicon film, a reset gate electrode 17R formed of the first level polysilicon film, the second horizontal electric charge transfer electrodes 19H1 and 19H2 formed of the second level polysilicon film, and a second output gate electrode 19OG formed of the second level polysilicon film. The N$^{++++}$ semiconductor region 9 constituting the reset drain region for the signal electric charge, is applied with the power supply voltage V$_D$ ordinarily on the order of 15 V.

Referring to FIG. 5A, there is shown a diagrammatic sectional view taken along the line III—III shown in FIG. 1, for illustrating the prior art unnecessary electric charge exhausting section. FIG. 5B is a potential profiles under the portion shown in FIG. 5A. The P-type well layer 2 is formed on the N$^{--}$ semiconductor substrate 1. On the P-type well layer 2, there are formed an N$^{++}$ semiconductor region 12 constituting the unnecessary electric charge exhausting section, an N$^{+++}$ semiconductor region 13 formed at one end of the unnecessary electric charge exhausting section, and the P$^{++}$ semiconductor region 4 constituting the device isolation section.

These regions are covered with a silicon oxide film (3, 16), on which there are formed the first horizontal electric charge transfer electrodes 17H1 and 17H2 formed of the first level polysilicon film, and the second horizontal electric charge transfer electrodes 19H1 and 19H2 formed of the second level polysilicon film. The N$^{++}$ semiconductor region 12 constituting the unnecessary electric charge exhausting section, is applied with the power supply voltage V$_D$ ordinarily on the order of 15 V, through the N$^{+++}$ semiconductor region 13 formed at the one end of the unnecessary electric charge exhausting section.

In an operation of the solid state image sensor having the above mentioned structure, as mentioned hereinbefore, the unnecessary electric charge existing in the photoelectric conversion cell 101, is removed, by forming the P⁻ semiconductor region having a low impurity concentration directly under the N type semiconductor region constituting the photoelectric conversion cell, and by supplying the N⁻⁻ semiconductor substrate 1 with a reverse biasing voltage (Vsub) which is larger than the power supply voltage $V_D$ ordinarily on the order of 15 V, so that the N type semiconductor region itself constituting the photoelectric conversion cell is caused to be put into a depletion condition whereby all the signal electric charge is removed into the N⁻⁻ semiconductor substrate 1.

In parallel to the above mentioned operation, the unnecessary electric charges existing in the vertical electric charge transfer sections 103, are simultaneously transferred towards the horizontal electric charge transfer section 300 by for example four-phase clock pulses φV1 to φV4. At this time, the horizontal electric charge transfer electrodes 17H1, 19H1 and 17H2, 19H2 are supplied with φH1 and φH2, respectively, which alternately and exclusively assume the high level voltage $V_H$ and the low level voltage $V_L$, as shown in FIG. 6. In addition, an excessive electric charge which cannot be stored in the horizontal electric charge transfer section 300, is caused to move beyond a potential ΨB of the potential barrier formed to become deeper than a potential ΨVH formed in the vertical-horizontal junction section 200 (shown in FIGS. 3A and 3B) so that the excessive electric charge is absorbed and removed into the N⁺⁺ semiconductor region 12 of the unnecessary electric charge exhausting section 500 adjacent to the potential barrier section 400, in order to prevent the electric charges from being returned back to the vertical electric charge transfer sections 103. Incidentally, since the transfer channel 14 of the vertical-horizontal junction section 200 has the width on the order of 2 μm to 3 μm and the same impurity concentration as those of the N type semiconductor regions 6 and 15, the potential ΨVH becomes shallower than a potential ΨHHS of the electric charge storage region 6 of the horizontal electric charge transfer section 300, because of a narrow channel effect.

Thereafter, the unnecessary electric charge remaining in the horizontal electric charge transfer section 300, is absorbed and removed into the N⁺⁺⁺ semiconductor region 9 of the reset drain provided at the end of the horizontal electric charge transfer section 300, by an ordinary high speed transfer operation of the horizontal electric charge transfer section driven by the two-phase clocks φH1 and φH2 as shown in FIG. 6.

Succeedingly, the signal electric charge stored in each photoelectric conversion cell 101, corresponding to the amount of light injected for a predetermined time period, is read out to the vertical electric charge transfer section 103, and thereafter, is further vertically transferred through the vertical electric charge transfer section 103, so that the signal electric charges are transferred to the horizontal electric charge transfer section 300 in units of one horizontal line, and are further horizontally transferred through the horizontal electric charge transfer section 300 and are outputted to the output amplifier 302 through the electric charge detection section 301 including the floating diffused region 8 and the output gate electrode 17OG.

Referring to FIGS. 7A to 7L, there are sectional views illustrating a method for manufacturing the prior art solid state image sensor having the above mentioned structure. FIGS. 7A, 7C, 7E, 7G, 7I and 7K are sectional views taken along the line Y—Y in FIG. 1, and FIGS. 7B, 7D, 7F, 7H, 7J and 7L are sectional views taken along the line X—X in FIG. 1. In addition, FIGS. 7A and 7B, FIGS. 7C and 7D, FIGS. 7E and 7F, FIGS. 7G and 7H, FIGS. 7I and 7J, and FIGS. 7K and 7L show the same steps, respectively.

As shown in FIGS. 7A and 7B, a P-well layer 2 is formed on an N⁻⁻ semiconductor substrate by implanting boron ions through a thin oxide silicon film 21 formed on the N⁻⁻ semiconductor substrate 1, or by conducting introduction of boron ions and a thermal diffusion. The P-well layer 2 is used to constitute the vertical electric charge transfer sections and the horizontal electric charge transfer section. Succeedingly, for the device isolation, a P⁺⁺ semiconductor region 4 is formed and a thick silicon oxide film 3 is formed by a selective oxidation.

Thereafter, as shown in FIGS. 7C and 7D, phosphorus ions are implanted through the thin oxide silicon film 21 by using the thick silicon oxide film 3 and a patterned photoresist film (not shown) as a mask, so that an N-type semiconductor region 6 is formed in a region in which the transfer channel of each vertical electric charge transfer section 103 is to be formed, and in a region in which the transfer channel of the horizontal electric charge transfer section 300, the potential barrier section 400 and the unnecessary electric charge exhausting section 500 are to be formed.

Then, as shown in FIGS. 7E and 7F, phosphorus ions are implanted through the thin oxide silicon film 21 by using the thick silicon oxide film 3 and a patterned photoresist film 22 as a mask, so that an N⁺⁺ semiconductor region 12 is formed to constitute the unnecessary electric charge exhausting section 500.

Further, as shown in FIGS. 7G and 7H, boron ions are implanted through the thin oxide silicon film 21 by using a patterned photoresist film 23 as a mask, so that an N⁻ semiconductor region 11 is formed to constitute the potential barrier section 400.

Thereafter, by maintaining the thin oxide silicon film 21 or by removing the thin oxide silicon film 21 and newly forming a thin oxide silicon film 16 as shown in FIGS. 7I and 7J, patterned first conductive electrodes are formed, which become transfer electrodes of the vertical electric charge transfer section 103 and the horizontal electric charge transfer section 300 (specifically, first horizontal electric charge electrodes 17H1, 17H2, an output gate electrode 17OG (shown in FIG. 4A) and a reset gate electrode 17R (shown in FIG. 4A) of the horizontal electric charge transfer section 300). Then, by using a photoresist film (not shown) having an opening on the region in which the horizontal electric charge transfer channel is to be formed, and the first horizontal electric charge electrodes 17H1, 17H2, as a mask, boron ions are implanted through the thin oxide silicon film 16 to form N⁻ semiconductor regions 5 which constitute an electric charge barrier region of the horizontal electric charge transfer section.

As shown in FIGS. 7K and 7L, a silicon oxide film 18 is formed to cover the first conductive electrodes, and then, patterned second conductive electrodes are formed, which become transfer electrodes of the vertical electric charge transfer section 103 and the horizontal electric charge transfer section 300 (specifically, second horizontal electric charge electrodes 19H1, 19H2 of the horizontal electric charge transfer section 300).

Furthermore, phosphorus ions are implanted by using as a mask a pattern photoresist (not shown), the thick silicon oxide film 3, the output gate electrode 17OG and the reset gate electrode 17R, to form a floating diffused region 8 (shown in FIG. 4A), a reset drain 9 (shown in FIG. 4A) and an N⁺⁺⁺ semiconductor region 13 (shown in FIG. 5A).

Thereafter, an interlayer insulator film (designated with Reference Numeral 20 in FIGS. 4A and 5A) are formed on the first and second conductive electrodes by a thermal oxidation or a CVD process. After the interlayer insulator film is formed, a metal film (not shown) for a light blocking and a wiring is deposited by sputtering, and then, patterned to form light blocking films and metal wiring conductors. Thereafter, a protection silicon oxide film is formed. Thus, the prior art solid state image sensor is obtained.

In the above mentioned prior art solid state image sensor having the unnecessary electric charge exhausting section provided adjacent to the horizontal electric charge transfer section with the potential barrier section being between the unnecessary electric charge exhausting section and the horizontal electric charge transfer section, the vertical electric charge transfer sections are located at one side of the horizontal electric charge transfer section, and bus lines (not shown) for supplying the pulse voltages $\phi H_1$ and $\phi H_2$ to the first and second horizontal transfer electrodes of the horizontal electric charge transfer section, are required to be located at the side of the horizontal electric charge transfer section opposite to the side of the horizontal electric charge transfer section coupled to the vertical electric charge transfer section. Therefore, it is necessary to form the transfer channel of the horizontal electric charge transfer section, the potential barrier section and the unnecessary electric charge exhausting section, under the first and second horizontal transfer electrodes of the horizontal electric charge transfer section. As a result, the number of manufacturing steps is disadvantageously larger than the number of manufacturing steps for a prior art solid state image sensor having no unnecessary electric charge exhausting section.

Furthermore, it was disadvantageously necessary to form the N⁻ semiconductor region 11 which constitutes the potential barrier required to be formed under the first conductive electrode, in a step different from a step for forming the N⁻ semiconductor region 5 which constitutes the electric charge barrier in the horizontal electric charge transfer section and which is required to be formed in a self-alignment with the first conductive electrode by using the first conductive electrode as a mask.

In addition, the N⁻ semiconductor region 11 (constituting the potential barrier and the N⁻ semiconductor region 5 constituting the electric charge barrier in the horizontal electric charge transfer section, are desired to have the same impurity concentration and the same potential. However, because of variation in the manufacturing process, when the potential $\Psi_B$ of the potential barrier becomes shallower than the potential $\Psi_{HB}$ of the electric charge barrier in the horizontal electric charge transfer section ($\Delta\Psi = \Psi_{HB} - \Psi_B > 0$, differently from the situation shown in FIG. 3B), the unnecessary electric charges which has remained in the electric charge barrier region, cannot be completely removed during one horizontal scan period, and therefore, an extra time (extra transfer times) is required to completely remove the unnecessary electric charges. Because of this, it was necessary to form to the effect that the potential $\Psi_B$ of the potential barrier is deeper than the potential $\Psi_{HHB}$ of the electric charge barrier in the horizontal electric charge transfer section ($\Delta\Psi \leq 0$), with the result that the electric charge transfer capacity of the horizontal electric charge transfer section is adversely restricted by the height of the potential barrier ($\Psi_B - \Psi_{HHS}$), and further has a variation.

SUMMARY OF THE INVENTION

Accordingly, it is an object of the present invention to provide a solid state image sensor which has overcome the above mentioned defect of the conventional one, and a method for manufacturing the same with a reduced number of manufacturing steps.

Another object of the present invention is to provide a solid state image sensor having an unnecessary electric charge exhausting section, which has no variation in the electric charge transfer, capacity of the horizontal electric charge transfer section, and which can be manufactured with a reduced number of manufacturing steps.

Still another object of the present invention is to provide a method for manufacturing the above mentioned solid state image sensor.

The above and other objects of the present invention are achieved in accordance with the present invention by a solid state image sensor comprising:

an image sensor section composed of a plurality of pixel arrays arranged in parallel to one another, each of the pixel arrays including a plurality of photoelectric conversion cells and a vertical electric charge transfer section coupled to the plurality of photoelectric conversion cells for receiving signal charges from the plurality of photoelectric conversion cells in parallel and for vertically transferring the received signal charges through the vertical electric charge transfer section;

a horizontal electric charge transfer section coupled to one end of each vertical electric charge transfer section through a vertical-horizontal junction section for receiving signal charges from the one end of each vertical electric charge transfer section in parallel and for horizontally transferring the received signal charges through the horizontal electric charge transfer section;

a potential barrier section formed adjacent to and along the horizontal electric charge transfer section; and an unnecessary electric charge exhausting section formed adjacent to and along the potential barrier section;

a transfer channel of each vertical electric charge transfer section, electric charge barrier regions of a transfer channel of the horizontal electric charge transfer section, and the potential barrier section being formed of a semiconductor region of a second conductivity simultaneously formed on a surface of a semiconductor region of a first conductivity formed on a principal surface of a semiconductor substrate, the second conductivity being opposite to the first conductivity, electric charge storage regions of the transfer channel of the horizontal electric charge transfer section, and a transfer channel of the vertical-horizontal junction section being formed of a semiconductor region of the second conductivity having a high impurity concentration and formed on the surface of the semiconductor region of the first conductivity, the electric charge barrier regions of the transfer channel of the horizontal electric charge transfer section and the electric charge storage regions of the transfer channel of the horizontal electric charge transfer section, being alternately arranged to constitute the transfer channel of the horizontal electric charge transfer section.

In one embodiment, he potential barrier section and the unnecessary electric charge exhausting section are covered with an insulator film, which is covered with electric charge transfer electrodes of the horizontal electric charge transfer section. In addition, the semiconductor substrate is of the second conductivity and the semiconductor region of the first conductivity is formed of a well layer formed on the principal surface of the semiconductor substrate.

According to another aspect of the present invention, there is provided a method for manufacturing a solid state image sensor which includes an image sensor section composed of a plurality of pixel arrays arranged in parallel to one another, each of the pixel arrays including a plurality of photoelectric conversion cells and a vertical electric charge transfer section coupled to the plurality of photoelectric conversion cells for receiving signal charges from the plurality of photoelectric conversion cells in parallel and for vertically transferring the received signal charges through the vertical electric charge transfer section, a horizontal electric charge transfer section coupled to one end of each vertical electric charge transfer section through a vertical-horizontal junction section for receiving signal charges from the none end of each vertical electric charge transfer section in parallel and for horizontally transferring the received signal charges through the horizontal electric charge transfer section, a potential barrier section formed adjacent to and along the horizontal electric charge transfer section, and an unnecessary electric charge exhausting section formed adjacent to and along the potential barrier section, the method comprising the steps of:

selectively introducing impurity of a second conductivity into a semiconductor region of a first conductivity formed on a principal surface of a semiconductor substrate, to form a first semiconductor region of the second conductivity in regions in which a transfer channel of each vertical electric charge transfer section, a transfer channel of the vertical-horizontal junction section, a transfer channel of the horizontal electric charge transfer section, the potential barrier section and the unnecessary electric charge exhausting section are to be formed;

introducing impurity of the second conductivity into a portion of the first semiconductor region in which the unnecessary electric charge exhausting section is to be formed, to form a second semiconductor region of the second conductivity forming first conductive electrodes which are arranged separately from and in parallel to one another with predetermined intervals and which extend over the first and second semiconductor regions of the second conductivity;

introducing impurity of the second conductivity into a portion of the first semiconductor region in which the transfer channel of the vertical-horizontal junction section and the transfer channel of the horizontal electric charge transfer section are to be formed, to form third semiconductor regions of the second conductivity in self alignment with the first conductive electrodes; and forming second conductive electrodes each positioned on the first and second semiconductor regions between each pair of adjacent first conductive electrodes.

In one embodiment, the semiconductor substrate is of the second conductivity and the semiconductor region of the first conductivity is formed of a well layer formed on the principal surface of the semiconductor substrate.

The above and other objects, features and advantages of the present invention will be apparent from the following description of preferred embodiments of the invention with reference to the accompanying drawings.

BRIEF DESCRIPTION OF THE DRAWINGS

FIG. 9A is a diagrammatic sectional view taken along the line I—I shown in FIGS. 1 and 8, of the one embodiment of the solid state image sensor in accordance with the present invention;

FIG. 9B is a potential profiles under the portion shown in FIG. 9A;

FIG. 10A is a diagrammatic sectional view taken along the line II—II shown in FIG. 1, for illustrating the horizontal electric charge transfer section of the one embodiment of the solid state image sensor in accordance with the present invention;

FIGS. 10B and 10C are potential profiles, under the portion shown in FIG. 10A, in different clock conditions;

FIGS. 12A to 12J are sectional views illustrating a method for manufacturing the one embodiment of the solid state image sensor in accordance with the present invention shown in FIGS. 8 to 11B.

DESCRIPTION OF THE PREFERRED EMBODIMENTS

Figure 1:
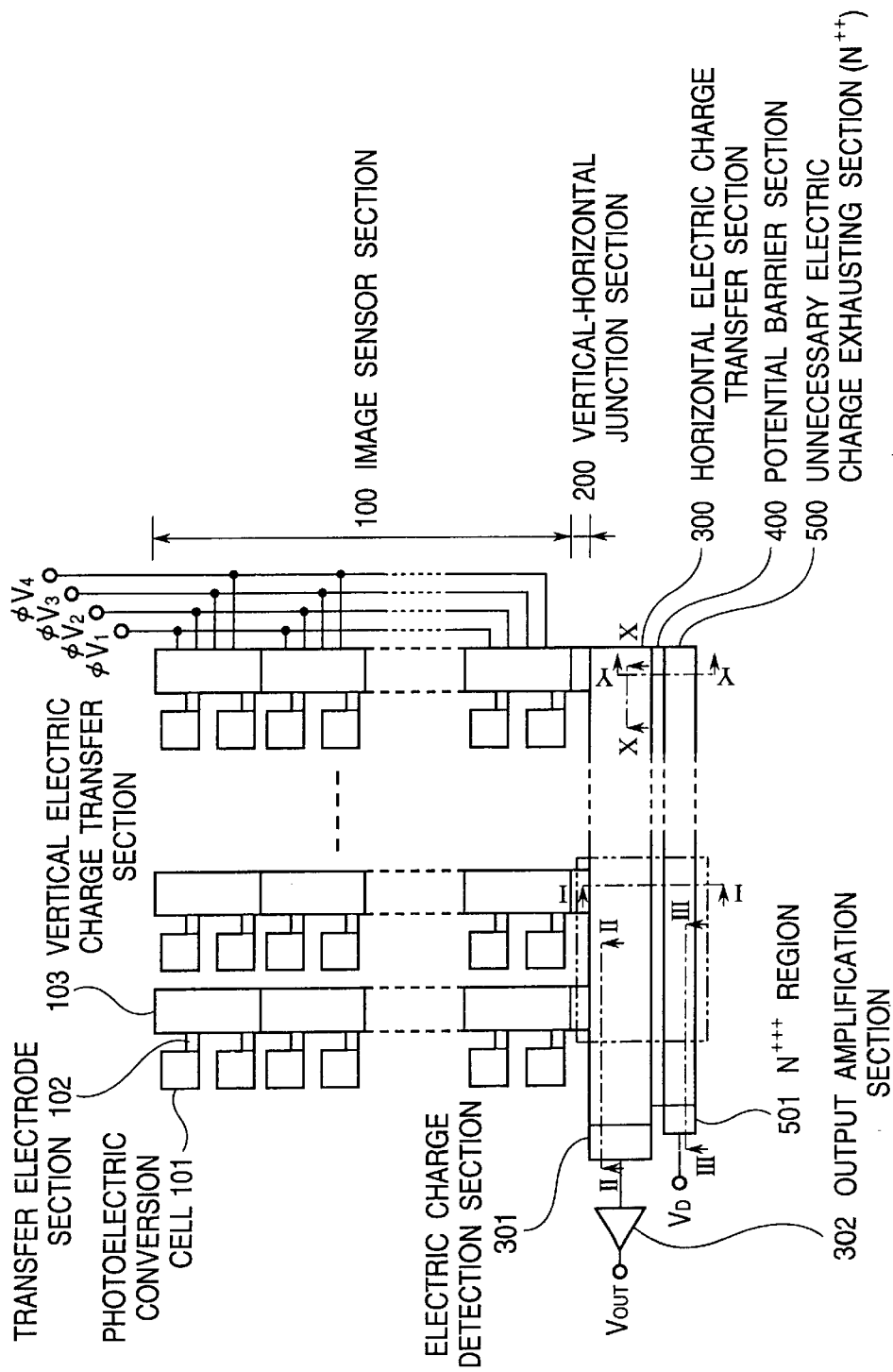
FIG. 1 is a layout diagram of the solid state image sensor having the unnecessary electric charge exhausting section provided adjacent to the horizontal electric charge transfer section.
Figure 2:
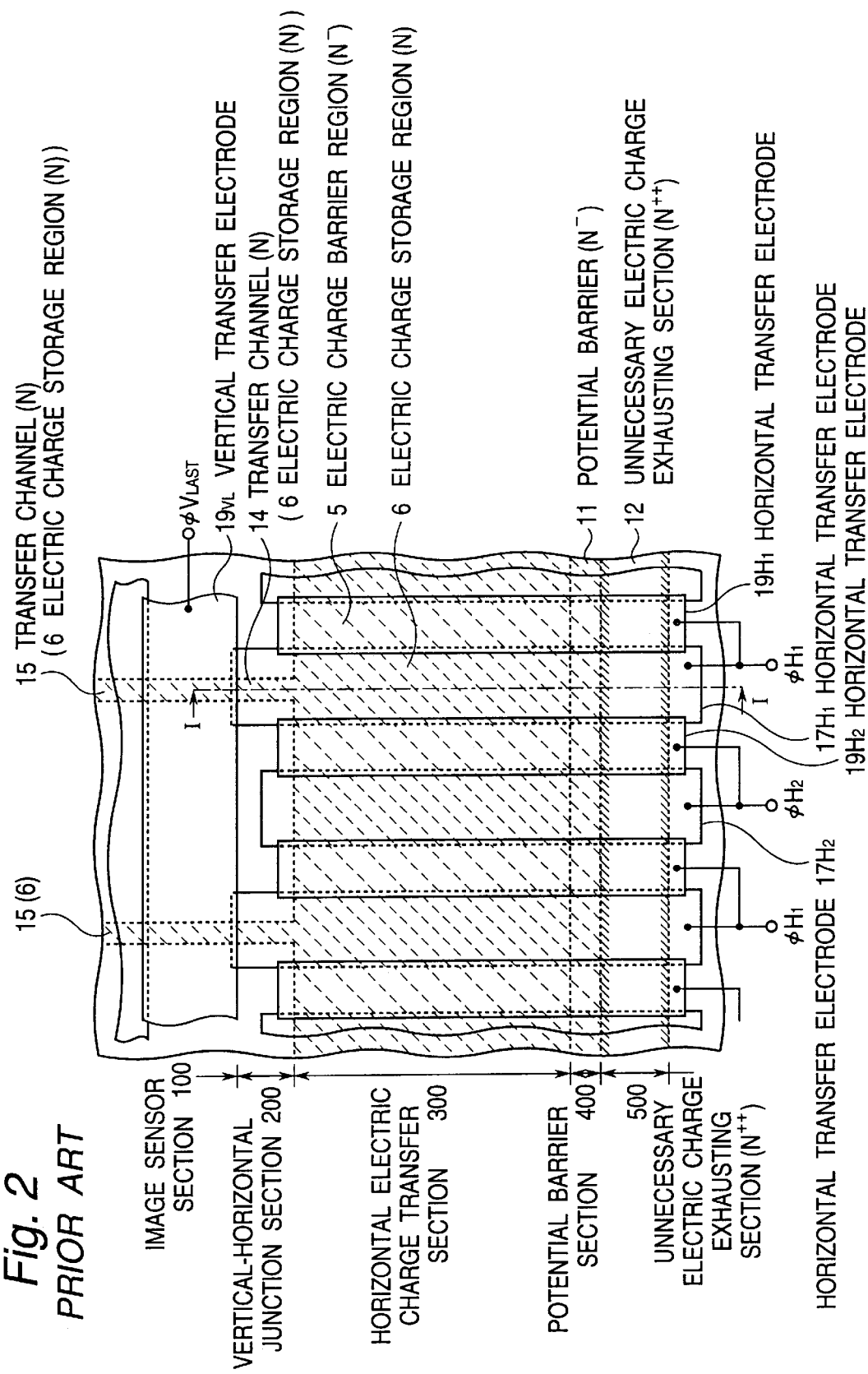
FIG. 2 is an enlarged layout pattern diagram of a portion confined by a two-dot chain line in FIG. 1, of the prior art solid state image sensor.
Figures 3A, 3B:
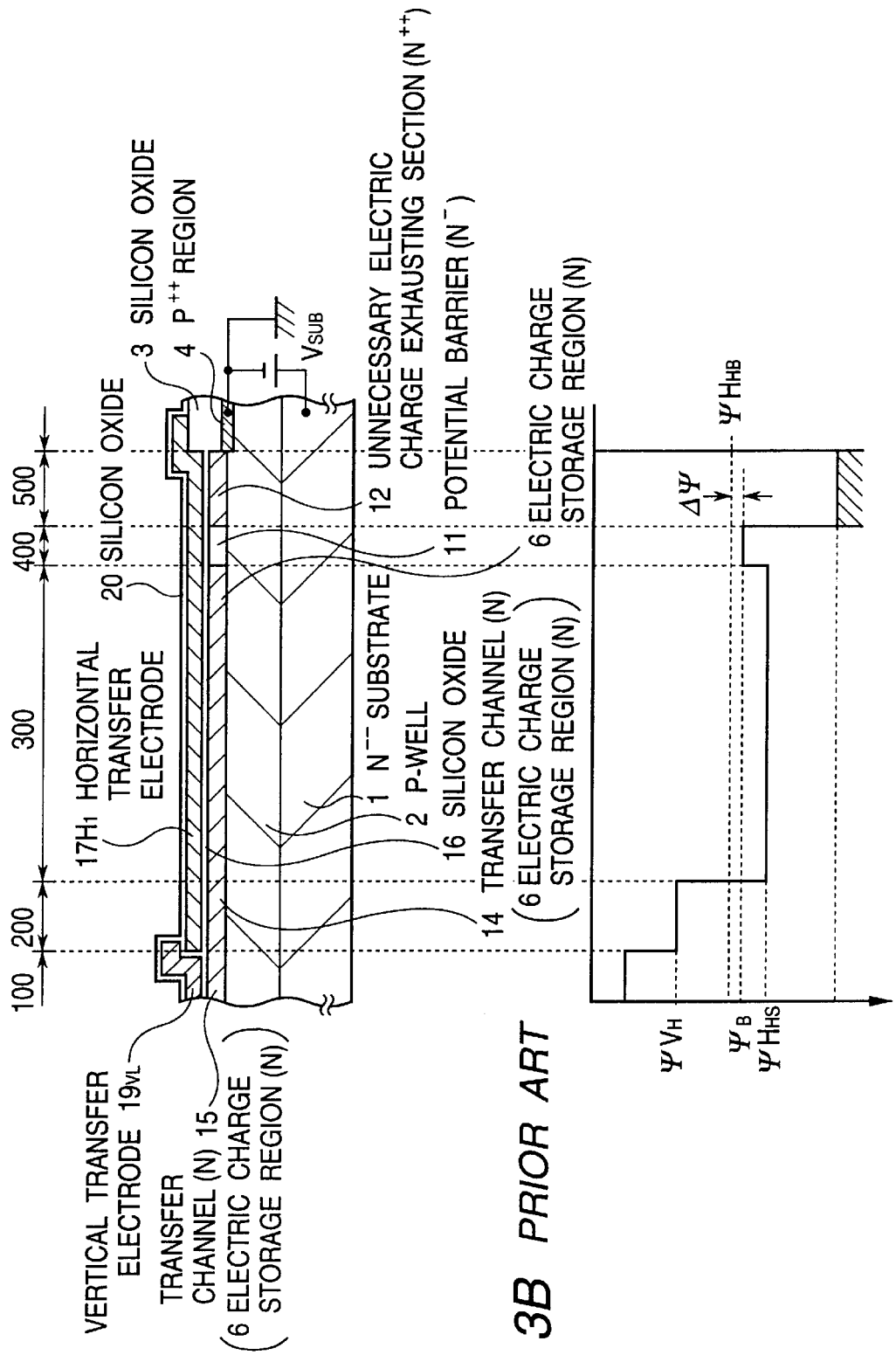
FIG. 3A is a diagrammatic sectional view taken along the line I—I shown in FIGS. 1 and 2, of the prior art solid state image sensor.
FIG. 3B is a potential profiles under the portion shown in FIG. 3A.
Figure 4A:
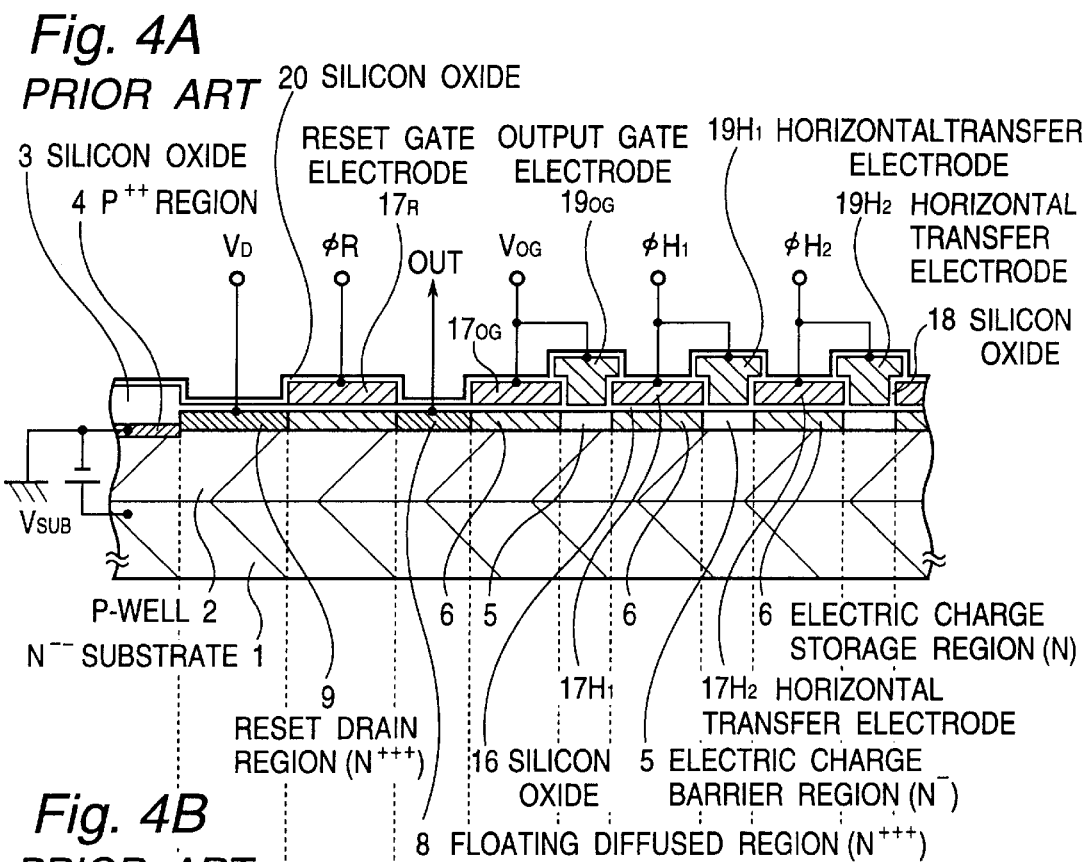
FIG. 4A is a diagrammatic sectional view taken along the line II—II shown in FIG. 1, for illustrating the prior art horizontal electric charge transfer section.
Figure 4B:
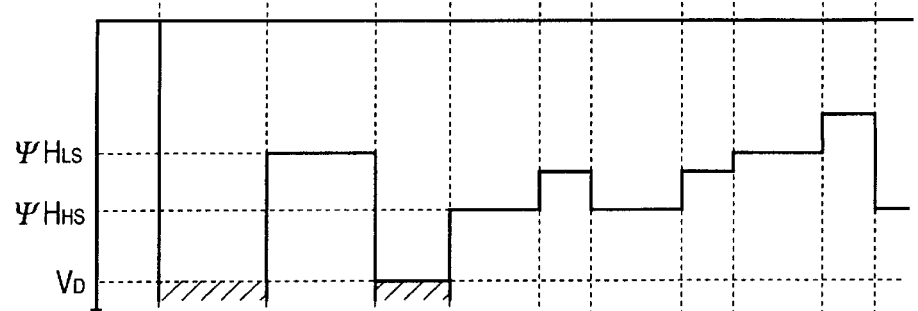
FIGS. 4B and 4C are potential profiles, under the portion shown in FIG. 4A, in different clock conditions.
Figure 4C:
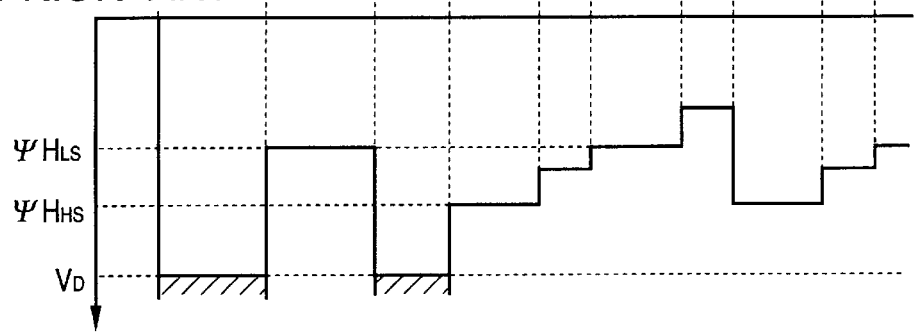
Figure 5A:
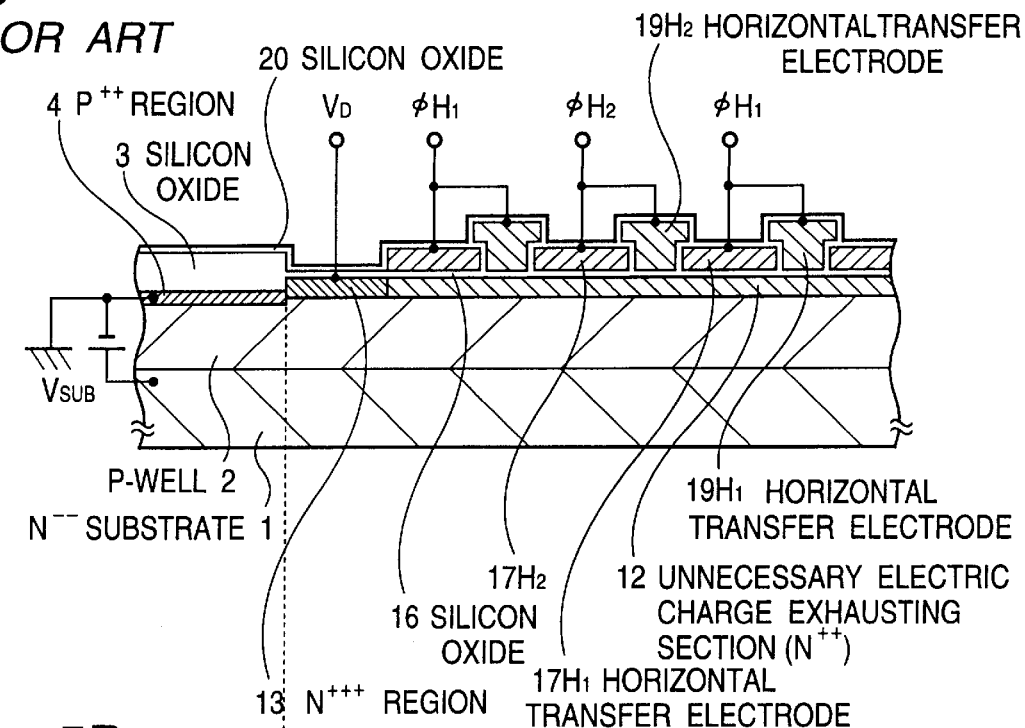
FIG. 5A is a diagrammatic sectional view taken along the line III—III shown in FIG. 1, for illustrating the prior art unnecessary electric charge exhausting section.
Figure 5B:
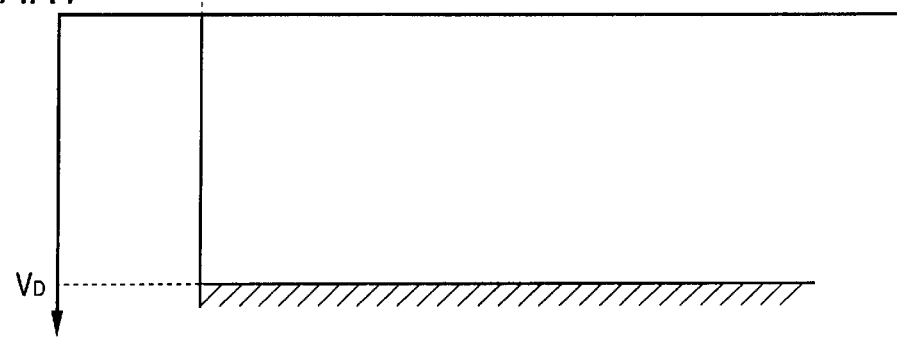
FIG. 5B is a potential profiles under the portion shown in FIG. 5A.
Figure 8:
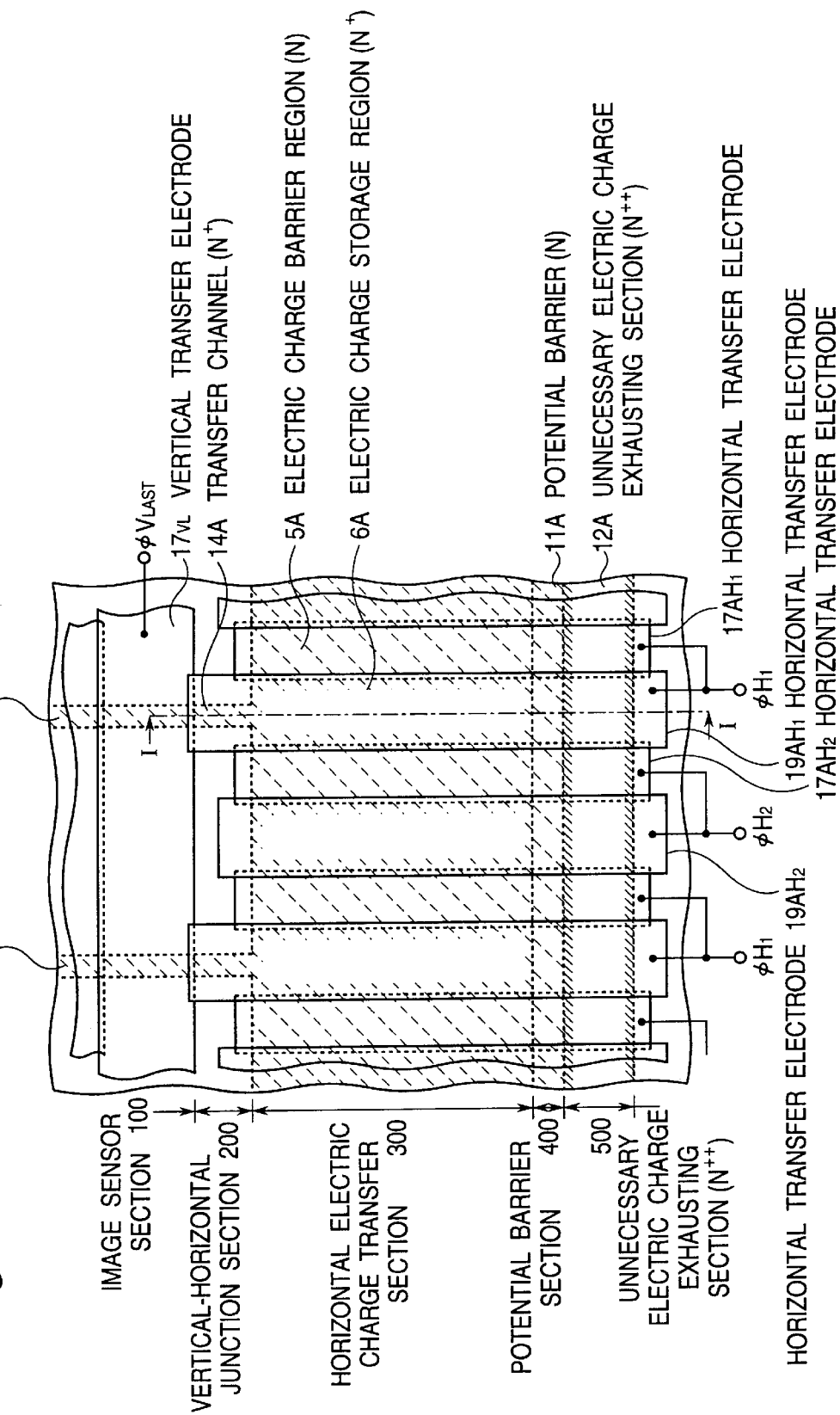
FIG. 8 is an enlarged layout pattern diagram of a portion confined by the two-dot chain line in FIG. 1, of one embodiment of the solid state image sensor in accordance with the present invention.

Referring to FIG. 8, there is shown an enlarged layout pattern diagram of a portion confined by the two-dot chain line in FIG. 1, of one embodiment of the solid state image sensor in accordance with the present invention, which shows a portion of a region including the potential barrier section 400 and the unnecessary electric charge exhausting section 500 formed adjacent to the horizontal electric charge transfer section 300.

The shown embodiment includes a transfer channel 15A of the vertical electric charge transfer section 103, a transfer channel 14A of the vertical-horizontal junction section 200, an electric charge barrier region 5A and an electric charge storage region 6A of a transfer channel of the horizontal electric charge transfer section 300, a potential barrier region 11A of the potential barrier section 400, an unnecessary electric charge exhausting region 12A of the unnecessary electric charge exhausting section 500.

The shown embodiment also includes first horizontal electric charge transfer electrodes 17AH1 and 17AH2 formed of a first level polysilicon film, of the horizontal electric charge transfer section 300, second horizontal electric charge transfer electrodes 19AH1 and 19AH2 formed of a second level polysilicon film, of the horizontal electric charge transfer section 300, and a final stage vertical electric charge transfer electrode 17VL formed of the first level polysilicon film, of the vertical electric charge transfer section 103. These horizontal electric charge transfer electrodes 17AH1 and 17AH2 and 19AH1 and 19AH2 are driven with the two-phase drive pulses $\phi$H1 and $\phi$H2, similarly to the prior art example explained hereinbefore.

Referring to FIG. 9A, there is shown a diagrammatic sectional view taken along the line I—I shown in FIGS. 1 and 8, of the solid state image sensor in accordance with the present invention. FIG. 9B is a potential profiles under the portion shown in FIG. 9A. On an $N^{--}$ semiconductor substrate 1 having the impurity concentration of for example $2.0\times10^{14}$ cm$^{-3}$, there is formed a P-type well layer 2 having the impurity concentration of for example $1.0\times10^{16}$ cm$^{-3}$.

On the P-type well layer 2, there are formed an $N^+$ type semiconductor region 6A having the impurity concentration of for example $1.3\times10^{17}$ cm$^{-3}$, which constitutes the transfer channel 15A of the vertical electric charge transfer section 103, the transfer channel 14A of the vertical-horizontal junction section 200, and the electric charge storage region of the transfer channel of the horizontal electric charge transfer section 300, an N type semiconductor region having the impurity concentration of for example $1.0\times10^{17}$ cm$^{-3}$, which constitutes a potential barrier region 11A of the potential barrier section 400 and an electric charge barrier region 5A of the horizontal electric charge transfer section 300 (the regions 5A and 11A are formed simultaneously), an $N^{++}$ semiconductor region 12A having the impurity concentration of for example $1.0\times10^{18}$ cm$^{-3}$, which constitutes the unnecessary electric charge exhausting section 500, and a $P^{++}$ semiconductor region 4 having the impurity concentration of for example $1.0\times10^{18}$ cm$^{-3}$, which constitutes a device isolation section.

Furthermore, the $P^{++}$ semiconductor region 4 is covered with the thick silicon oxide film 3, and the other regions are covered with the thin silicon oxide film 16. On these silicon oxide films, there are formed the first horizontal electric charge transfer electrodes 17AH1, 17AH2 (not shown in FIG. 9A) and the final vertical transfer electrode 17AVL formed of the first level polysilicon film. These transfer electrodes are covered with a thin silicon oxide film, on which there are formed the second horizontal electric charge transfer electrodes 19AH1, 19AH2 formed of the second level polysilicon film. Here, the $N^{++}$ semiconductor region 12A constituting the unnecessary electric charge exhausting section, is applied with a power supply voltage VD ordinarily on the order of 15 V through an $N^{+++}$ semiconductor region (designated by Reference Numeral 13 in FIG. 11A) having the impurity concentration of for example $1.0\times10^{20}$ cm$^{-3}$ and formed at one end of the unnecessary electric charge exhausting section.

Referring to FIG. 10A, there is shown a diagrammatic sectional view taken along the line II—II shown in FIG. 1, for illustrating the horizontal electric charge transfer section of the solid state image sensor in accordance with the present invention. FIG. 10B is a potential profiles under the portion shown in FIG. 10A when $\phi$H1 is VL and $\phi$H2 is VH, and FIG. 10C is a potential profiles under the portion shown in FIG. 10A when $\phi$H1 is VH and $\phi$H2 is VL.

The P-type well layer 2 is formed on the $N^{--}$ semiconductor substrate 1. On the P-type well layer 2, there are formed the N semiconductor regions having the impurity concentration of for example $1.0\times10^{17}$ cm$^{-3}$, each constituting the electric charge barrier region 5A the transfer channel of the horizontal electric charge transfer section, the $N^+$ type semiconductor regions having the impurity concentration of for example $1.3\times10^{17}$ cm$^{-3}$, each constituting the electric charge storage region 6A of the transfer channel of the horizontal electric charge transfer section, $N^{+++}$ semiconductor regions 8A and 9A constituting a floating diffused region and a reset drain region, respectively, and the $P^{++}$ semiconductor region 4 constituting the device isolation section.

Furthermore, the $P^{++}$ semiconductor region 4 is covered with the thick silicon oxide film 3 and the other regions are covered with the thin silicon oxide film 16. On the silicon oxide film 16, there are formed the first horizontal electric charge transfer electrodes 17AH1 and 17AH2 formed of the first level polysilicon film, and an output gate electrode 17AOG formed of the first level polysilicon film. These electrodes are covered with the thin silicon oxide film 18, on which there are formed the second horizontal electric charge transfer electrodes 19AH1 and 19AH2 formed of the second level polysilicon film, a second output gate electrode 19AOG formed of the second level polysilicon film, and a reset gate electrode 19AR formed of the second level polysilicon film. Here, an $N^{+++}$ semiconductor region 9A constituting the reset drain region for the signal electric charge, is applied with the power supply voltage VD ordinarily on the order of 15 V.

Figure 11A:
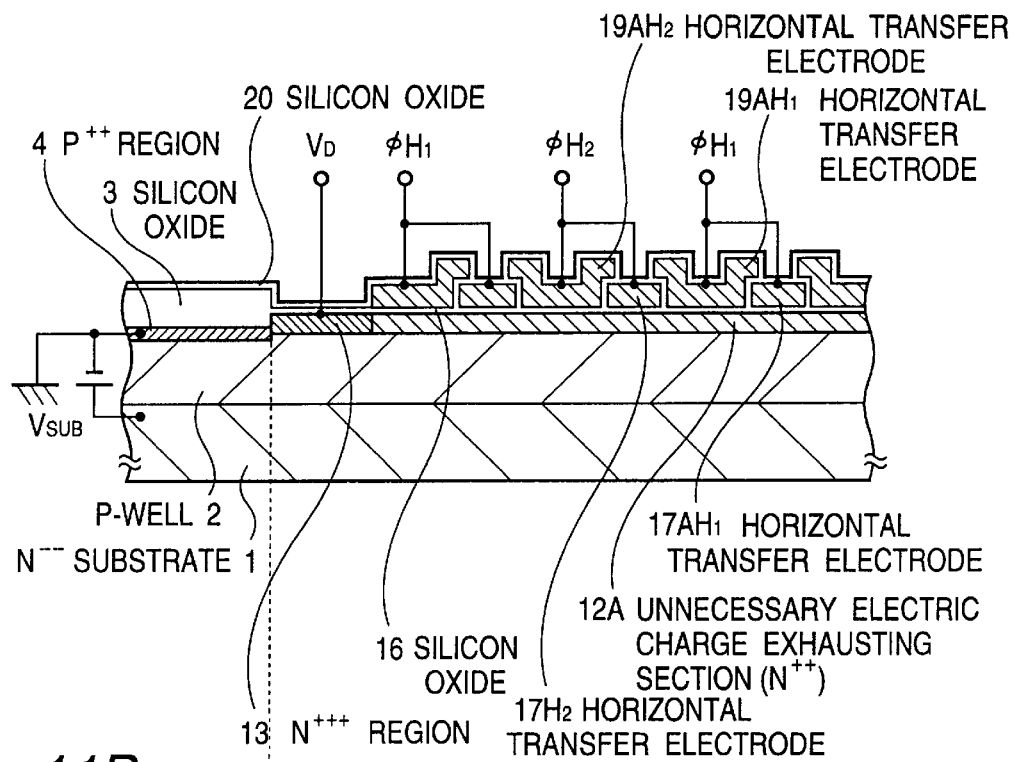
FIG. 11A is a diagrammatic sectional view taken along the line III—III shown in FIG. 1, for illustrating the unnecessary electric charge exhausting section of the one embodiment of the solid state image sensor in accordance with the present invention.
Figure 11B:
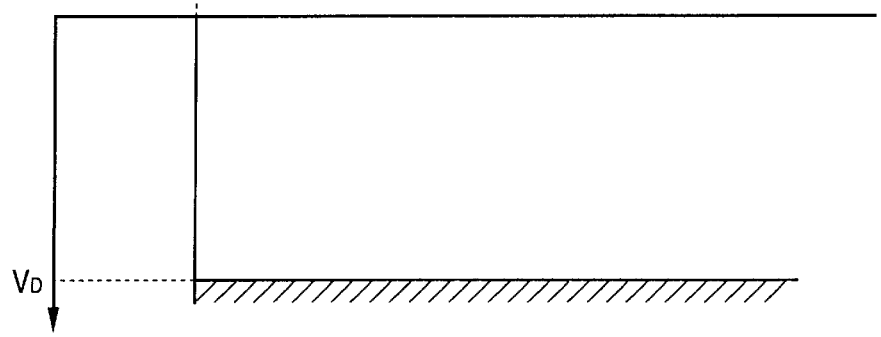
FIG. 11B is a potential profiles under the portion shown in FIG. 11A.

Referring to FIG. 11A, there is shown a diagrammatic sectional view taken along the line III—III shown in FIG. 1, for illustrating the unnecessary electric charge exhausting section of the solid state image sensor in accordance with the present invention. FIG. 11B is a potential profiles under the portion shown in FIG. 11A. The P-type well layer 2 is formed on the $N^{--}$ semiconductor substrate 1. On the P-type well layer 2, there are formed an $N^{++}$ semiconductor region 12A constituting the unnecessary electric charge exhausting section, an $N^{+++}$ semiconductor region 13 (designated with Reference Numeral 501 in FIG. 1) formed at one end of the unnecessary electric charge exhausting section, and the $P^{++}$ semiconductor region 4 constituting the device isolation section. The $P^{++}$ semiconductor region 4 is covered with the thick silicon oxide film 3, and the other regions are covered with the thin silicon oxide film 16.

On the silicon oxide film 16, there are formed the first horizontal electric charge transfer electrodes 17AH1 and 17AH2 formed of the first level polysilicon film, and the second horizontal electric charge transfer electrodes 19AH1 and 19AH2 formed of the second level polysilicon film The $N^{++}$ semiconductor region 12A constituting the unnecessary electric charge exhausting section, is applied with the power supply voltage VD ordinarily on the order of 15 V, through the $N^{+++}$ semiconductor region 13 formed at the one end of the unnecessary electric charge exhausting section.

An operation of the above mentioned embodiment of the solid state image sensor in accordance with the present invention is similar to that of the prior art solid state image sensor as mentioned hereinbefore.

Namely, as mentioned hereinbefore, the unnecessary electric charge existing in the photoelectric conversion cell 101, is removed, by forming the P⁻ semiconductor region having a low impurity concentration directly under the N type semiconductor region constituting the photoelectric conversion cell, and by supplying the N⁻⁻ semiconductor substrate 1 with a reverse biasing voltage which is larger than the power supply voltage V$_D$ ordinarily on the order of 15 V, so that the N type semiconductor region itself is caused to be put into a depletion condition whereby all the signal electric charge is removed into the N⁻⁻ semiconductor substrate 1.

Figure 6:
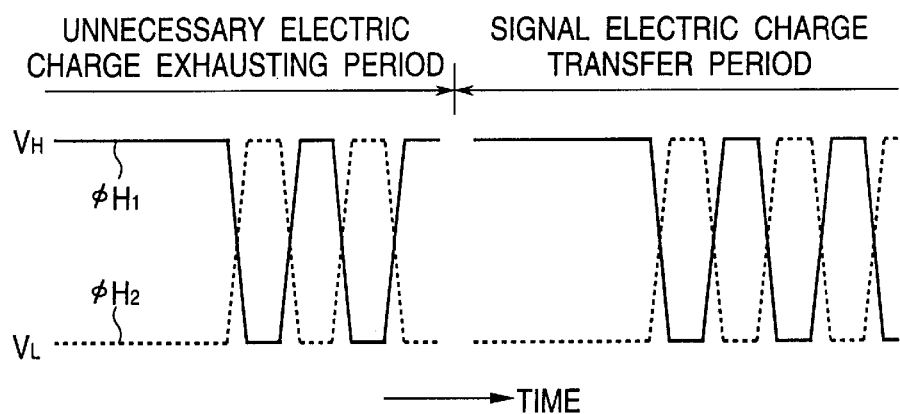
FIG. 6 illustrates two-phase clocks $\phi H_1$ and $\phi H_2$ applied to the horizontal electric charge transfer electrodes $17H_1$, $19H_1$ and $17H_2$, $19H_2$, respectively.
Figure 7B:
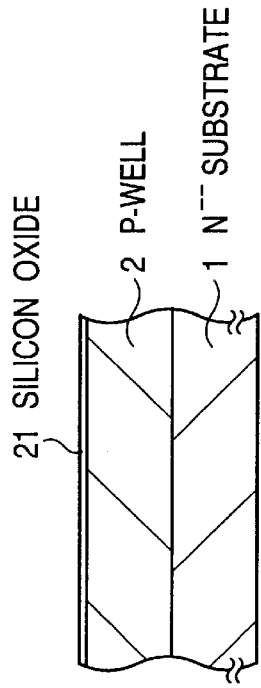
FIGS. 7A to 7L are sectional views illustrating a method for manufacturing the prior art solid state image sensor having the structure shown in FIGS. 2 to 5B.
Figure 7D:
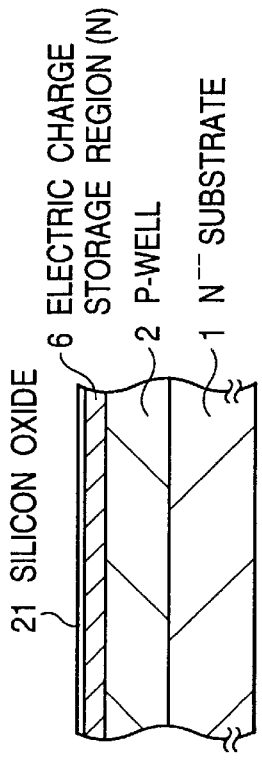
Figure 7A:
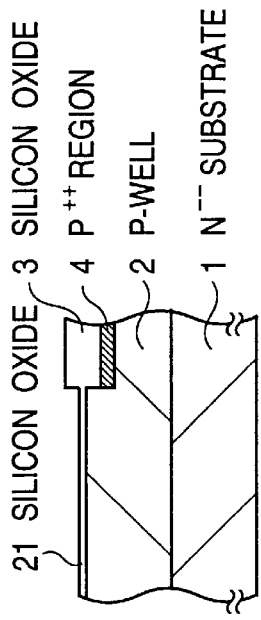
Figure 7C:
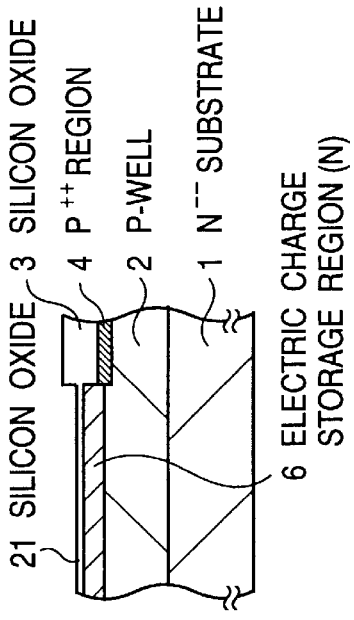
Figure 7E:
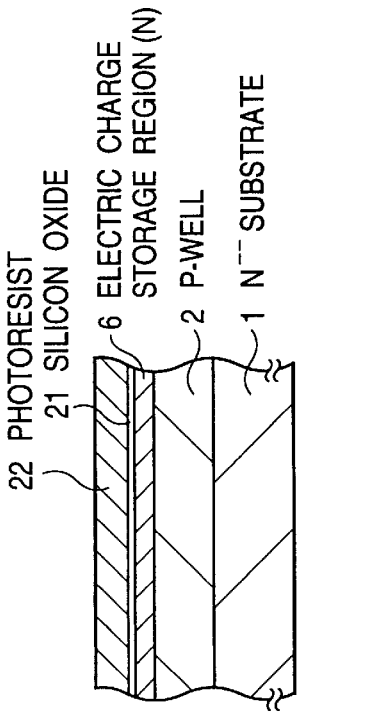
Figure 7F:
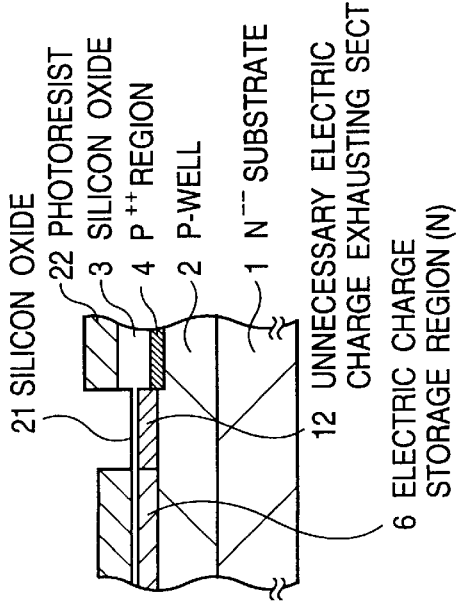
Figure 7G:
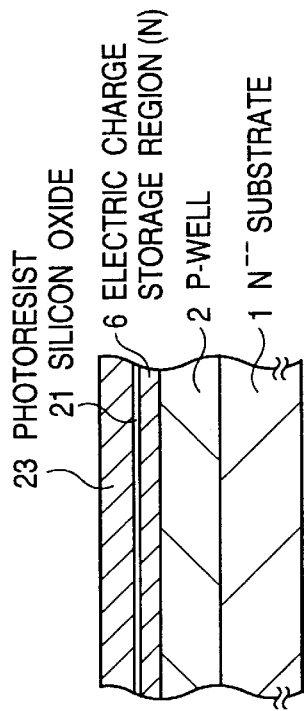
Figure 7H:
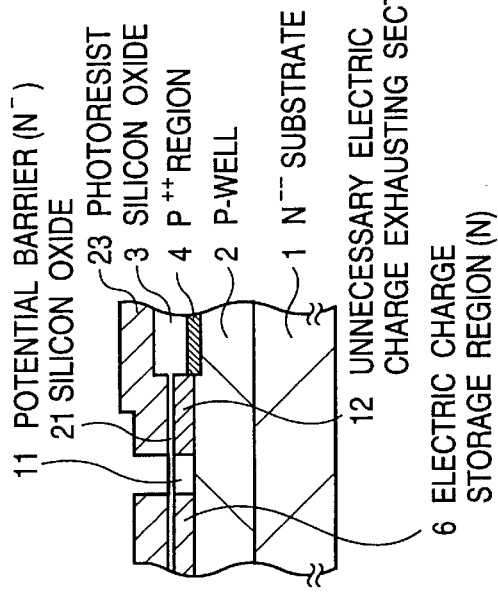
Figure 7I:
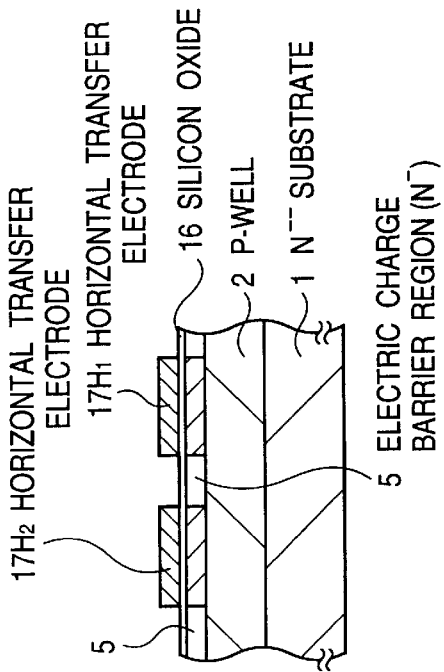
Figure 7J:
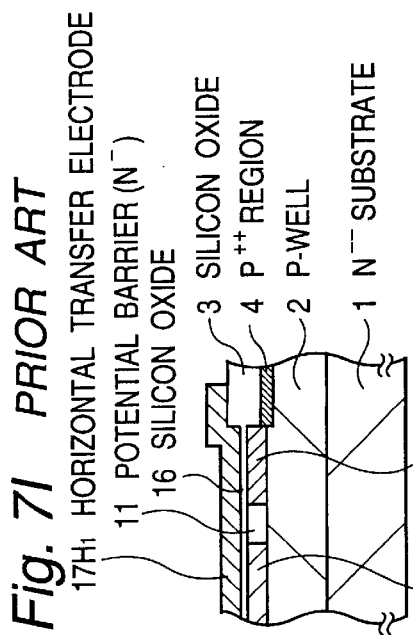
Figure 7K:
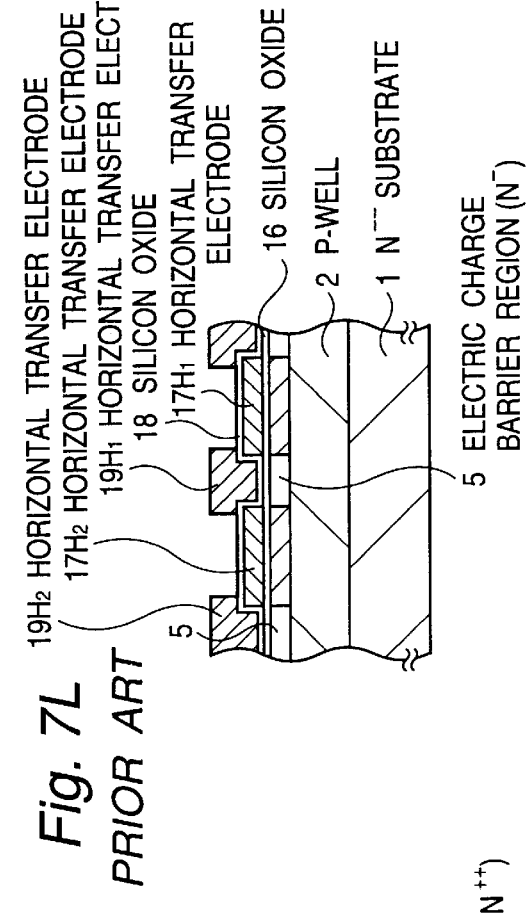
Figure 7L:
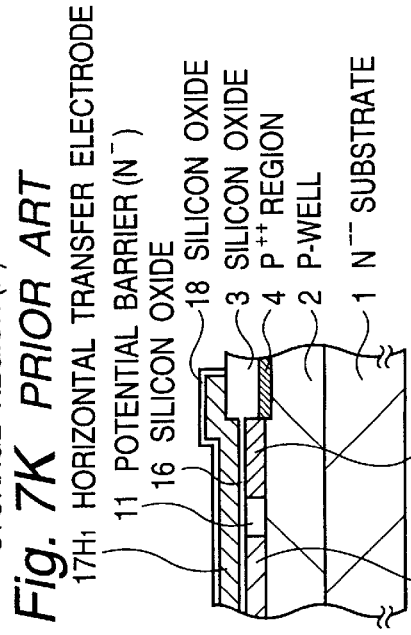

In parallel to the above mentioned operation, the unnecessary electric charges existing in the vertical electric charge transfer sections 103, are simultaneously transferred towards the horizontal electric charge transfer section 300 by for example four-phase clock pulses φV1 to φV4. Incidentally, φVLAST is made equal to for example φV4. At this time, the horizontal electric charge transfer electrodes 17H1, 19H1 and 17H2, 19H2 are supplied with φH1 and φH2, respectively, which alternately and exclusively assume a high level voltage V$_H$ and a low level voltage V$_L$, as shown in FIG. 6. In addition, an excessive electric charge which cannot be stored in the electric charge storage region 6A of the horizontal electric charge transfer section 300, is caused to move beyond a potential Ψ$_B$ of the potential barrier 11A which is formed to become deeper than a potential ΨV$_H$ (FIG. 9B) formed in the vertical-horizontal junction section 200 and which has the same potential as that of the electric charge barrier region 5A of the horizontal electric charge transfer section, so that the excessive electric charge is absorbed and removed into the N⁺⁺ semiconductor region 12A of the adjacent unnecessary electric charge exhausting section 500 adjacent to the potential barrier section 400, in order to prevent the electric charges from being returned back to the vertical electric charge transfer sections 103. Incidentally, since the transfer channel 14A has the width on the order of 2 μm to 3 μm and the same impurity concentration as those of the N type semiconductor region 6A, the potential ΨV$_H$ becomes shallower than a potential ΨH$_{HS}$ of the electric charge storage region 6A of the horizontal electric charge transfer section 300, because of a narrow channel effect.

Thereafter, the unnecessary electric charge remaining in the horizontal electric charge transfer section 300, is absorbed and removed into the N⁺⁺⁺ semiconductor region 9A of the reset drain provided at the end of the horizontal electric charge transfer section 300, by an ordinary high speed transfer operation of the horizontal electric charge transfer section driven by the two-phase clocks φH1 and φH2 as shown in FIG. 6.

Succeedingly, the signal electric charge stored in each photoelectric conversion cell 101, corresponding to the amount of light injected for a predetermined time period, is read out to the corresponding vertical electric charge transfer section 103, and thereafter, is further vertically transferred through the vertical electric charge transfer section 103, so that the signal electric charges are transferred to the horizontal electric charge transfer section 300 in units of one horizontal line, and are further horizontally transferred through the horizontal electric charge transfer section 300 and are outputted to the output amplifier 302 through the electric charge detection section 301 including the floating diffused region 8A and the output gate electrode 19A$_{OG}$.

Referring to FIGS. 12A to 12J, there are sectional views illustrating a method for manufacturing the embodiment of the solid state image sensor in accordance with the present invention, having the above mentioned structure. FIGS. 12A, 12C, 12E, 12G and 12I are sectional views taken along the line Y—Y in FIG. 1, and FIGS. 12B, 12D, 12F, 12H and 12J are sectional views taken along the line X—X in FIG. 1. In addition, FIGS. 12A and 12B, FIGS. 12C and 12D, FIGS. 12E and 12F, FIGS. 12G and 12H, and FIGS. 12I and 12J show the same steps, respectively.

Figure 12A:
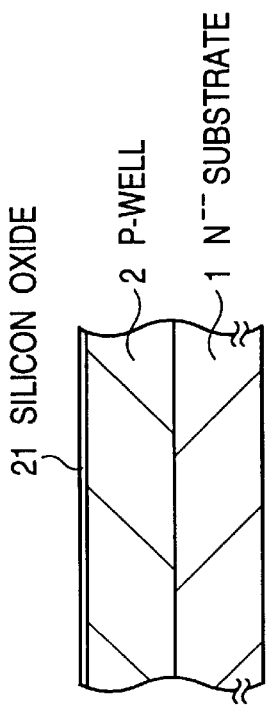
Figure 12C:
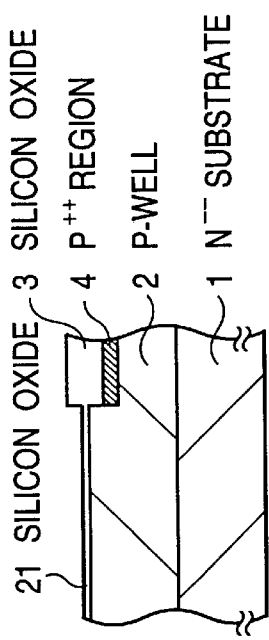
Figure 12B:
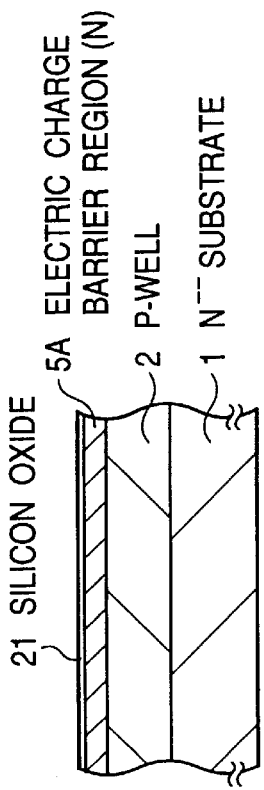

As shown in FIGS. 12A and 12B, the P-well layer 2 is formed on an N⁻⁻ semiconductor substrate 1 formed of silicon, by implanting boron ions through a thin oxide silicon film 21 formed on the N⁻⁻ semiconductor substrate 1, or by conducting introduction of boron ions and a thermal diffusion. Succeedingly, for the device isolation, the P⁺⁺ semiconductor region 4 is formed and the thick silicon oxide film 3 is formed by a selective oxidation.

Figure 12D:
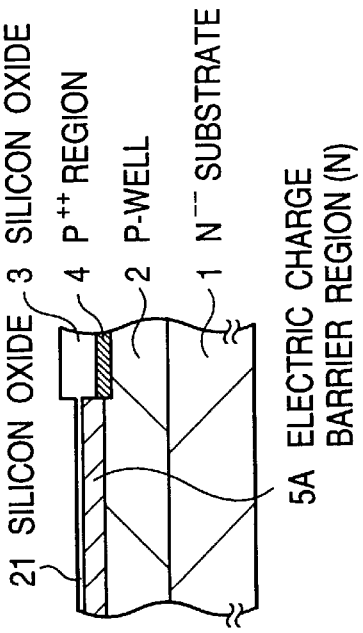

Thereafter, as shown in FIGS. 12C and 12D, phosphorus ions are implanted through the thin oxide silicon film. 21 by using the thick silicon oxide film 3 and a patterned photoresist film (not shown) as a mask, so that the N-type semiconductor region 5A is formed in a region in which the transfer channel of each vertical electric charge transfer section 103 is to be formed, and in a region in which the transfer channel of the horizontal electric charge transfer section 300, the potential barrier section 400 and the unnecessary electric charge exhausting section 500 are to be formed.

Then, as shown in. FIGS. 12E and 12F, phosphorus ions are implanted through the thin oxide silicon film 21 by using the thick silicon oxide film 3 and a patterned photoresist film 22 as a mask, so that the N⁺⁺ semiconductor region 12A is formed to constitute the unnecessary electric charge exhausting section 500.

Thereafter, by maintaining the thin oxide silicon film 21 or by removing the thin oxide silicon film 21 and newly forming a thin oxide silicon film 16 as shown in FIGS. 12G and 12H, patterned first conductive electrodes are formed, which become transfer electrodes of the vertical electric charge transfer section 103 and the horizontal electric charge transfer section 300 (specifically, the first horizontal electric charge electrodes 17AH1, 17AH2 and the output gate electrode 17A$_{OG}$ (shown in FIG. 10A) of the horizontal electric charge transfer section 300). Then, by using a photoresist film 24 having an opening on the region in which the horizontal electric charge transfer channel is to be formed, and the first horizontal electric charge electrodes 17H1, 17H2, as a mask, phosphorus ions are implanted through the thin oxide silicon film 16 to form the N⁻ semiconductor regions 6A which constitute the electric charge storage region of the horizontal electric charge transfer section.

Figure 12J:
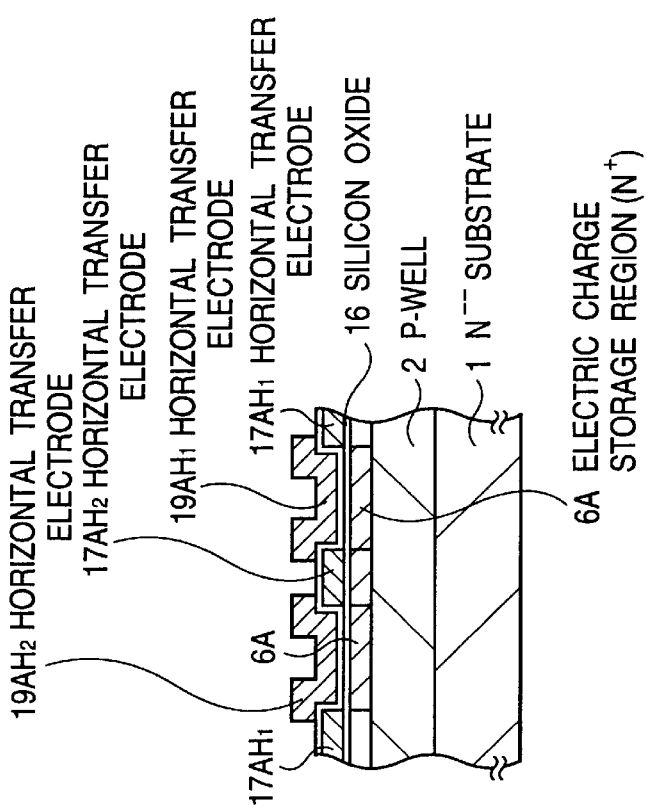
Figure 12I:
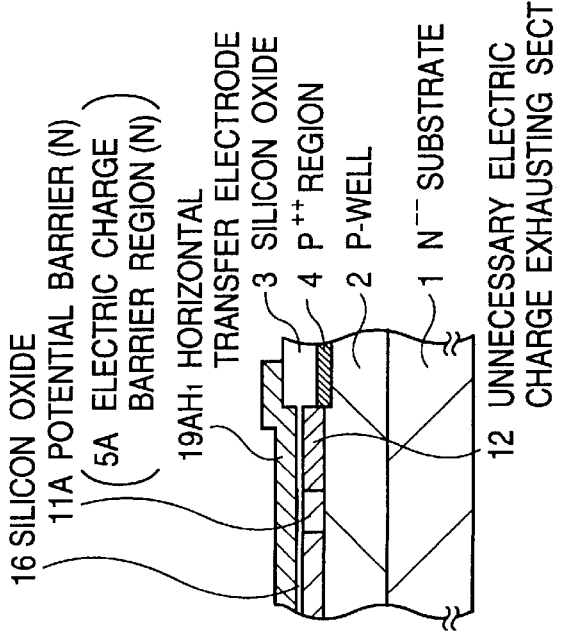

Then, as shown in FIGS. 12I and 12J, a silicon oxide film 18 is formed to cover the first conductive electrodes, and then, patterned second conductive electrodes are formed, which become transfer electrodes of the vertical electric charge transfer section 103 and the horizontal electric charge transfer section 300 (specifically, second horizontal electric charge electrodes 19AH1, 19AH2, the output gate electrode 19A$_{OG}$ and the reset gate electrode 19A$_R$ of the horizontal electric charge transfer section 300).

Furthermore, phosphorus ions are implanted by using as a mask a pattern photoresist (not shown), the thick silicon oxide film 3, the output gate electrode 19A$_{OG}$ and the reset gate electrode 19A$_R$, to form the floating diffused region 8A (shown in FIG. 10A), the reset drain 9A (shown in FIG. 10A) and the N⁺⁺⁺ semiconductor region 13 (shown in FIG. 11A).

Thereafter, an interlayer insulator film (designated with Reference Numeral 20 in FIGS. 10A and 11A) are formed on the first and second conductive electrodes by a thermal oxidation or a CVD process. After the interlayer insulator film is formed, a metal film (not shown) used for a light blocking and a wiring is deposited by sputtering, and then, patterned to form light blocking films and metal wiring conductors. Thereafter, a protection silicon oxide film is formed. Thus, the solid state image sensor in accordance with the present invention is obtained.

As mentioned above, in the solid state image sensor in accordance with the present invention, the N type semiconductor layer constituting the potential barrier and the N type semiconductor layer constituting the electric charge barrier region of the horizontal electric charge transfer section are formed simultaneously. Therefore, the number of manufacturing steps can be reduced in comparison with the number of manufacturing steps required for the prior art solid state image sensor having the unnecessary electric charge exhausting section.

Furthermore, since the N type semiconductor layer constituting the potential barrier and the N type semiconductor layer constituting the electric charge barrier region of the horizontal electric charge transfer section are formed simultaneously, the potential $\Psi_B$ of the potential barrier section and the potential $\Psi_{HHB}$ of the electric charge barrier region in the horizontal electric charge transfer section are necessarily the same. Accordingly, it is possible to overcome the disadvantage of the prior art solid state image sensor in which the electric charge transfer capacity of the horizontal electric charge transfer section is adversely restricted by the height of the potential barrier and further has a variation.

The invention has thus been shown and described with reference to the specific embodiments. However, it should be noted that the present invention is in no way limited to the details of the illustrated structures but changes and modifications may be made within the scope of the appended claims.

What is claimed is:

1. A solid state image sensor comprising:
   an image sensor section composed of a plurality of pixel arrays arranged in parallel to one another, each of said pixel arrays including a plurality of photoelectric conversion cells and a vertical electric charge transfer section coupled to said plurality of photoelectric conversion cells for receiving signal charges from said plurality of photoelectric conversion cells in parallel and for vertically transferring the received signal charges through said vertical electric charge transfer section;
   a horizontal electric charge transfer section coupled to one end of each vertical electric charge transfer section through a vertical-horizontal junction section for receiving signal charges from said one end of each vertical electric charge transfer section in parallel and for horizontally transferring the received signal charges through said horizontal electric charge transfer section;
   a potential barrier section formed adjacent to and along said horizontal electric charge transfer section opposite to said vertical electric charge section; and
   an unnecessary electric charge exhausting section formed adjacent to and along said potential barrier section;
   a transfer channel of each vertical electric charge transfer section, electric charge barrier regions of a transfer channel of said horizontal electric charge transfer section, and said potential barrier section being formed of a semiconductor region of a second conductivity having the same impurity concentration and being simultaneously formed on a surface of a semiconductor region of a first conductivity formed on a principal surface of a semiconductor substrate, said second conductivity being opposite to said first conductivity,
   electric charge storage regions of said transfer channel of said horizontal electric charge transfer section, and a transfer channel of said vertical-horizontal junction section being formed of a semiconductor region of said second conductivity having a high impurity concentration and formed on said surface of said semiconductor region of said first conductivity, said electric charge barrier regions of said transfer channel of said horizontal electric charge transfer section and said electric charge storage regions of said transfer channel of said horizontal electric charge transfer section, being alternately arranged to constitute said transfer channel of said horizontal electric charge transfer section.

2. A solid state image sensor claimed in claim 1 wherein said potential barrier section and said unnecessary electric charge exhausting section are covered with an insulator film, which is covered with electric charge transfer electrodes of said horizontal electric charge transfer section.

3. A solid state image sensor claimed in claim 2 wherein said semiconductor substrate is of said second conductivity and said semiconductor region of said first conductivity is formed of a well layer formed on said principal surface of said semiconductor substrate.

4. A method for manufacturing a solid state image sensor which includes
   an image sensor section composed of a plurality of pixel arrays arranged in parallel to one another, each of said pixel arrays including a plurality of photoelectric conversion cells and a vertical electric charge transfer section coupled to said plurality of photoelectric conversion cells for receiving signal charges from said plurality of photoelectric conversion cells in parallel and for vertically transferring the received signal charges through said vertical electric charge transfer section,
   a horizontal electric charge transfer section coupled to one end of each vertical electric charge transfer section through a vertical-horizontal junction section for receiving signal charges from said one end of each vertical electric charge transfer section in parallel and for horizontally transferring the received signal charges through said horizontal electric charge transfer section,
   a potential barrier section formed adjacent to and along said horizontal electric charge transfer section opposite to said vertical electric charge section, and
   an unnecessary electric charge exhausting section formed adjacent to and along said potential barrier section,
   the method comprising the steps of:
   selectively introducing impurity of a second conductivity into a semiconductor region of a first conductivity formed on a principal surface of a semiconductor substrate, to form a first semiconductor region of said second conductivity in regions in which a transfer channel of each vertical electric charge transfer section, a transfer channel of said vertical-horizontal junction section, a transfer channel of said horizontal electric charge transfer section, said potential barrier section and said unnecessary electric charge exhausting section are to be formed;
   introducing impurity of said second conductivity into a portion of said first semiconductor region in which said unnecessary electric charge exhausting section is to be formed, to form a second semiconductor region of said second conductivity forming first conductive electrodes which are arranged separately from and in parallel to one another with predetermined intervals and which extend over said first and second semiconductor regions of said second conductivity;

introducing impurity of said second conductivity into a portion of said first semiconductor region in which said transfer channel of said vertical-horizontal junction section and said transfer channel of said horizontal electric charge transfer section are to be formed, to form third semiconductor regions of said second conductivity in self alignment with said first conductive electrodes; and forming second conductive electrodes each positioned on said first and second semiconductor regions between each pair of adjacent first conductive electrodes.

5. A method claimed in claim 4 wherein said semiconductor substrate is of said second conductivity and said semiconductor region of said first conductivity is formed of a well layer formed on said principal surface of said semiconductor substrate.

* * * * *